US012655932B2

(12) United States Patent
Xing et al.

(10) Patent No.: US 12,655,932 B2
(45) Date of Patent: Jun. 16, 2026

(54) CASE AND MOUNTING PIECE THEREOF, AND ELECTRICAL DEVICE

(71) Applicant: Sungrow Power Supply Co., Ltd., Hefei (CN)

(72) Inventors: Jun Xing, Hefei (CN); Zhanliang Shen, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 137 days.

(21) Appl. No.: 18/291,763

(22) PCT Filed: Jul. 27, 2022

(86) PCT No.: PCT/CN2022/108098
§ 371 (c)(1),
(2) Date: Jan. 24, 2024

(87) PCT Pub. No.: WO2023/005954
PCT Pub. Date: Feb. 2, 2023

(65) Prior Publication Data
US 2024/0263736 A1 Aug. 8, 2024

(30) Foreign Application Priority Data
Jul. 29, 2021 (CN) .......................... 202121779019.2

(51) Int. Cl.
*H05K 5/00* (2025.01)
*F16M 13/02* (2006.01)
(Continued)

(52) U.S. Cl.
CPC ........... *F16M 13/02* (2013.01); *H05K 5/0204* (2013.01); *H05K 5/03* (2013.01)

(58) Field of Classification Search
CPC ........ F16M 13/02; H05K 5/0204; H05K 5/03; H05K 7/1427; H05K 5/0217; H05K 5/13
See application file for complete search history.

(56) References Cited

U.S. PATENT DOCUMENTS 6,091,024 A 7/2000 Korhonen
10,416,729 B2 * 9/2019 Sun ...................... G11B 33/124
(Continued)

FOREIGN PATENT DOCUMENTS

CN 105782810 A 7/2016
CN 205378419 U 7/2016
(Continued)

OTHER PUBLICATIONS

JPO, Japanese Application No. 2023-567940 Office Action with translationmailed Nov. 25, 2024, Nov. 25, 2024.

*Primary Examiner* — Rockshana D Chowdhury
(74) *Attorney, Agent, or Firm* — Woodard, Emhardt, Henry, Reeves & Wagner, LLP

(57) ABSTRACT

A mounting piece of the case includes a case connecting outer wall and a cover plate connecting outer wall, wherein the case connecting outer wall is provided with a through hole allowing for a case fixing part on an inner wall of a case body to pass through. The provision of the through hole in the mounting piece of the case to allow the case fixing part on the inner wall of the case body to pass through enables the case fixing part to be directly fixed to the case body, without providing a hole in the case body, such that water-proofing can be achieved without providing a seal between the mounting piece and the case body, thus effectively reducing installation materials and improving installation efficiency.

17 Claims, 22 Drawing Sheets

(51) Int. Cl.
  *H05K 5/02* (2006.01)
  *H05K 5/03* (2006.01)

(56) References Cited

U.S. PATENT DOCUMENTS

| | | | | |
|---|---|---|---|---|
| 10,932,380 | B2* | 2/2021 | Huston | H05K 5/0217 |
| 11,347,278 | B2* | 5/2022 | Han | G02F 1/133325 |
| 11,934,231 | B2* | 3/2024 | Dunbar | G06F 1/1656 |
| 12,063,493 | B2* | 8/2024 | Ji | H04R 1/028 |
| 2002/0036888 | A1 | 3/2002 | Oogami | |
| 2016/0135315 | A1 | 5/2016 | Weber | |
| 2020/0225709 | A1* | 7/2020 | Chen | H05K 5/0217 |
| 2020/0260601 | A1* | 8/2020 | Park | G06F 1/1637 |
| 2020/0343925 | A1* | 10/2020 | Huang | A45C 11/003 |
| 2021/0251088 | A1* | 8/2021 | Su | B29C 65/606 |
| 2022/0312605 | A1* | 9/2022 | Wang | H05K 7/142 |
| 2023/0239381 | A1* | 7/2023 | Seo | H05K 5/00 455/550.1 |

FOREIGN PATENT DOCUMENTS

| | | | |
|---|---|---|---|
| CN | 208952325 | U | 6/2019 |
| CN | 210038153 | U | 2/2020 |
| CN | 112533421 | A | 3/2021 |
| CN | 215379554 | U | 12/2021 |
| JP | S5041460 | U | 4/1975 |
| JP | S60098975 | U | 7/1985 |
| JP | H01109205 | U | 7/1989 |
| JP | H02123177 | U | 10/1990 |
| JP | H0436283 | U | 3/1992 |
| JP | H05003612 | U | 1/1993 |
| JP | H09207683 | A | 8/1997 |
| JP | H10303578 | A | 11/1998 |
| JP | 2002091623 | A | 3/2002 |
| JP | 2005273313 | A | 10/2005 |
| JP | 2016075430 | A | 5/2016 |
| JP | 2016529697 | A | 9/2016 |

* cited by examiner

CASE AND MOUNTING PIECE THEREOF, AND ELECTRICAL DEVICE

The present application is a National Phase entry of PCT Application No. PCT/CN2022/108098, filed on Jul. 27, 2022, which claims priority to Chinese Patent Application No. 202121779019.2, titled "CASE AND MOUNTING PIECE THEREOF, AND ELECTRICAL DEVICE", filed on Jul. 29, 2021 with the China National Intellectual Property Administration, which are incorporated herein by reference in their entireties.

FIELD

The present application relates to the technical field of electrical device, and in particular to a case, a mounting bracket of the case, and an electrical device.

BACKGROUND

As shown in FIGS. 1 and 2, a case of an electrical device mainly includes: a case body 01, a cover plate 03, and a mounting bracket 02 connecting the cover plate 03 and the case body 01. The mounting bracket 02 is fixed to a first wall 011 and a third wall 013 of the case body 01 through case screws 04.

In the above structure, the case body 01 has a case through hole 014, thus a sealing gasket 05 is required to be provided between the mounting bracket 02 and the case body 01 to be waterproof, resulting in a large amount of mounting materials and a low assembly efficiency.

In addition, the mounting bracket 02 is mounted on the first wall 011 and the third wall 013, that is, the mounting bracket 02 is mounted on two planes. The mounting process thereof is cumbersome and the assembly efficiency is low. When the case screws 04 are fastened onto the first wall 011 and mounting bracket 02, the sight is easily blocked by the second wall 012 of the case body 01, so the operation is difficult to operate. The mounting bracket 02 is fixed to the first wall 011, thus the space for electrical components inside the case body 01 is occupied, and the case body 01 needs to be enlarged to ensure safety distance, resulting in a larger size, a larger volume, and a higher cost of the entire case. Threaded holes 022 and grooves 021 for accommodating the sealing gasket 05 are required to be formed in the mounting bracket 02, resulting in complicated processing and low production efficiency of the mounting bracket 02. Heads of the case screws 04 are exposed, which affects the aesthetics of the entire case.

In summary, how to design the mounting bracket to reduce mounting materials and improve assembly efficiency is an urgent problem to be solved by those skilled in the art.

SUMMARY

An object of the present application is to provide a mounting bracket for a case, so as to reduce mounting materials and improve assembly efficiency. Another object of the present application is to provide a case comprising the mounting bracket and an electrical device comprising the case.

In order to achieve the above objects, the present application provides the following technical solutions.

A mounting bracket for a case includes a case-connecting outer wall and a cover-plate-connecting outer wall. The case-connecting outer wall has a through hole for a case fixing member of a case inner wall to pass through, or the case-connecting outer wall has a rack fixing member for fixed connection with a case blind bole of the case inner wall.

In an embodiment, at least two through holes are provided, and any two of the at least two through holes are located in a same plane.

In an embodiment, the through hole is a step hole or an equal-diameter hole.

In an embodiment, the mounting bracket for the case further includes an auxiliary pressing block. The auxiliary pressing block is configured for fixed connection with the case inner wall to press the case-connecting outer wall against the case inner wall.

In an embodiment, the auxiliary pressing block has an auxiliary through hole for a case auxiliary fixing member of the case inner wall to pass through.

In an embodiment, the case-connecting outer wall has a positioning structure configured to be in positioning cooperation with the case inner wall.

In an embodiment, the positioning structure is a positioning hole. The positioning hole is configured to be in positioning cooperation with a positioning column on the case inner wall.

In an embodiment, the mounting bracket for a case further includes at least one limiting surface, the at least one limiting surface is configured to be in position-limiting cooperation with a limiting member on the case inner wall, the limiting surface is perpendicular to the case-connecting outer wall, or there is an included angle between the limiting surface and the case-connecting outer wall;

in a case that two limiting surface are provided, the through hole is located between the two limiting surfaces.

In an embodiment, the rack fixing member is a screw stud, and the case blind hole is a threaded hole; and the mounting bracket of the case is a mounting column, the rack fixing member is located at one end of the mounting column, and a cross section of the mounting column is of a regular hexagon.

In an embodiment, the cover-plate-connecting outer wall has a mounting hole for fixed connection with a cover plate, and the cover-plate-connecting outer wall is configured for sealing connection with the cover plate.

In an embodiment, the mounting hole is a blind hole, and/or the mounting hole is a threaded hole.

In an embodiment, the cover-plate-connecting outer wall is configured for sealing connection with the cover plate through a mounting bracket seal, the cover-plate-connecting outer wall has a mounting groove for mounting the mounting bracket seal, and the mounting groove is located on a periphery of the mounting hole.

In an embodiment, the mounting bracket for the case includes a first mounting part and a second mounting part;

the cover-plate-connecting outer wall and the mounting hole are located at the second mounting part; and the case-connecting outer wall and the through hole are located at the first mounting part, and the first mounting part is fixedly connected to the case inner wall to press the second mounting part against the case inner wall.

In an embodiment, one end, away from the cover-plate-connecting outer wall, of the second mounting part has a crimping flange; and the first mounting part has a crimping step hole, the first mounting part is mounted outside the second mounting part through the crimping step hole, and a step surface of the crimping step hole is pressed onto the crimping flange.

In an embodiment, an axis of the mounting hole is parallel to an axis of the through hole.

In an embodiment, the through hole is arranged at the periphery of the mounting hole.

In an embodiment, the mounting bracket for the case includes a first mounting part and a second mounting part that are fixedly connected. The first mounting part is of a flat-plate shape, the case-connecting outer wall and the through hole are located at the first mounting part, and the cover-plate-connecting outer wall and the mounting hole are located at the second mounting part.

In an embodiment, the second mounting part is located in the middle of the first mounting part, or the second mounting part is located at one end of the first mounting part.

In an embodiment, an axis of the mounting hole is perpendicular to an axis of the through hole.

In an embodiment, the mounting bracket for the case includes a first mounting part and a second mounting part that are fixedly connected. The second mounting part is arranged on one side of the first mounting part, an avoidance structure is formed on a side, away from the second mounting part, of the first mounting part, the case-connecting outer wall and the through hole are located at the first mounting part, and the cover-plate-connecting outer wall and the mounting hole are located at the second mounting part.

According to the mounting bracket for the case provided by the present application, the through hole is provided to allow the case fixing member of the case inner wall to pass through, so that the case fixing member can be directly fixed in the case body without forming a hole in the case body. Thus, waterproofing can be achieved without providing a seal between the mounting bracket and the case body, which effectively reduces mounting materials and improves assembly efficiency. The rack fixing member is provided, and the rack fixing member is configured for fixed connection with the case blind hole of the case inner wall, so that the case blind hole can be directly formed at the case inner wall to avoid forming a through hole at the case inner wall, waterproofing can be achieved without providing a seal between the mounting bracket and the case body, which effectively reduces mounting materials and improves assembly efficiency.

In addition, according to the mounting bracket for the case provided by the present application, the case body and the mounting bracket can be fixed inside the case body, which avoids the exposure of the case fixing member and the case connecting member connected to the case fixing member, and improves the aesthetics of the entire case. Moreover, compared with providing a threaded hole, that providing the through hole simplifies processing, effectively improves processing efficiency, and reduces processing costs. Since there is no need to provide a seal between the mounting bracket and the case body, there is no need to provide a groove to accommodate the seal, which simplifies the processing, effectively improves the processing efficiency and reduces the processing costs.

Based on the mounting bracket for the case described above, the case is also provided according to the present application. The case includes a case body, a cover plate, and a mounting bracket;

the mounting bracket is the mounting bracket described above;

the case-connecting outer wall has a through hole for a case fixing member of a case inner wall to pass through, the case fixing member is fixed to the case inner wall of the case body, the case further comprises a case connecting member, the case connecting member is fixedly connected to the case fixing member to fixedly connect the mounting bracket and the case body; or the case-connecting outer wall has a rack fixing member for fixed connection with a case blind hole of the case inner wall, and the case blind hole is formed at the case inner wall of the case body.

In an embodiment, at least two mounting brackets are provided, at least one of the at least two mounting brackets is any one of the following mounting brackets:

an axis of the mounting bole is parallel to an axis of the through hole;

the through hole is arranged on a periphery of the mounting hole;

the mounting bracket includes a first mounting part and a second mounting part that are fixedly connected, the first mounting part is of a flat-plate shape, the case-connecting outer wall and the through hole are located at the first mounting part, and the cover-plate-connecting outer wall and the mounting hole are located at the second mounting part; and the second mounting part is located in the middle of the first mounting part, or the second mounting part is located at one end of the first mounting part;

at least one of the at least two mounting brackets is any one of the following mounting brackets:

the axis of the mounting hole is perpendicular to the axis of the through hole; and the mounting bracket includes a first mounting part and a second mounting part that are fixedly connected, the second mounting part is arranged on one side of the first mounting part, and an avoidance structure is formed on a side of the first mounting part away from the second mounting part, the case-connecting outer wall and the through hole are located at the first mounting part, and the cover-plate-connecting outer wall and the mounting hole are located at the second mounting part.

In an embodiment, the case fixing member is a fixing column, the fixing column has a threaded hole, and the case connecting member is a screw that is in threaded cooperation with the threaded hole; or, the case fixing member is a screw, and the case connecting member is a nut that is in threaded cooperation with the screw.

In an embodiment, the case fixing member is pressed and riveted to the case body.

In an embodiment, a case fixing column is fixed to the case inner wall of the case body, and the case blind hole is formed at the case fixing column.

Based on the case described above, an electrical device is also provided according to the present application. The electrical device includes the case described above.

BRIEF DESCRIPTION OF THE DRAWINGS

In order to more clearly illustrate the technical solutions in the embodiments of the present application or in the conventional technology, the following will briefly introduce drawings required in the description of the embodiments or the conventional technology. Apparently, the drawings in the following description are only the embodiments of the present application. For those skilled in the art, other drawings can also be obtained based on the provided drawings without creative efforts.

DETAILED DESCRIPTION OF EMBODIMENTS

Figure 1:
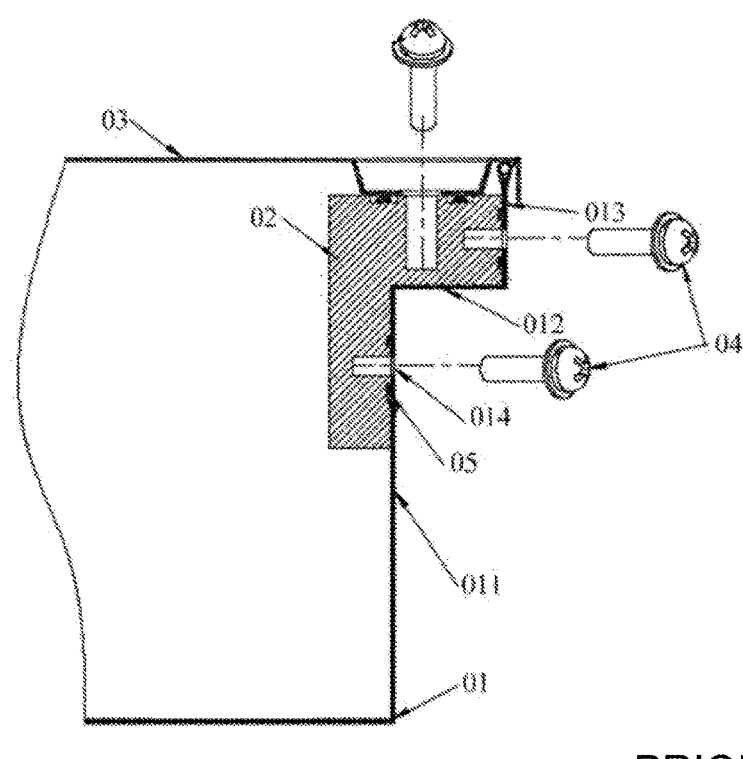
FIG. 1 is a schematic structural diagram of a case provided according to the conventional technology.
Figure 2:
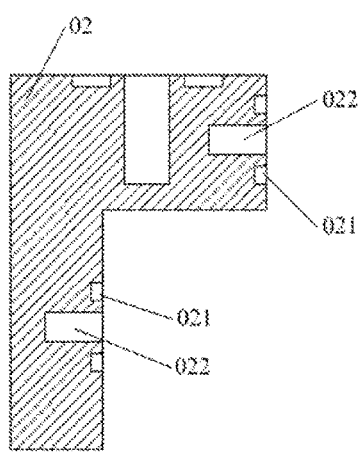
FIG. 2 is a schematic structural diagram of a mounting bracket in FIG. 1.
Figure 3:
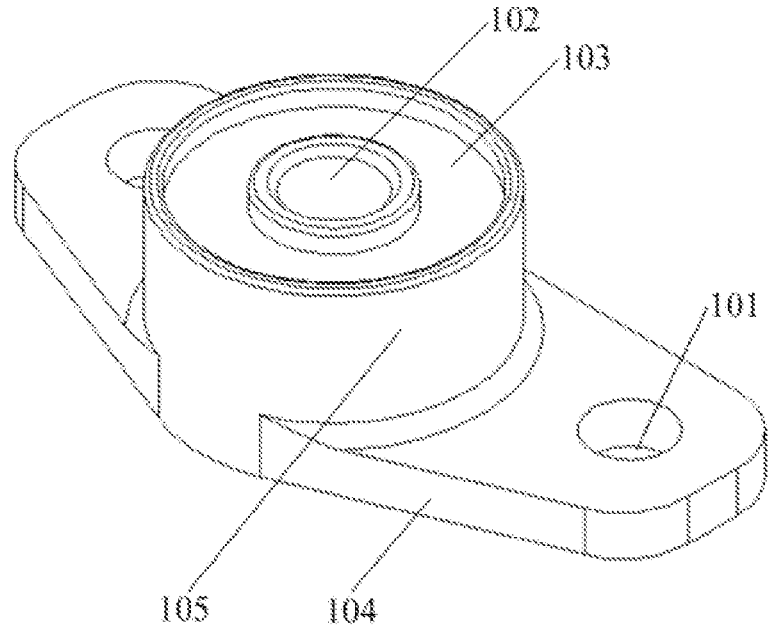
FIG. 3 is a schematic structural diagram of a mounting bracket for a case provided according to Embodiment 1 of the present application.
Figure 4:
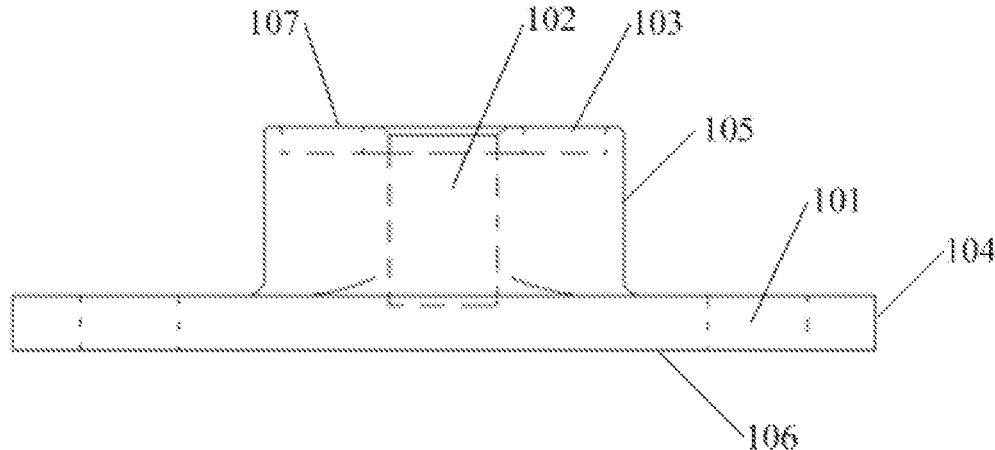
FIG. 4 is a front view of the structure shown in FIG. 3.

The technical solutions in the embodiments of the present application are clearly and completely described below in conjunction with the drawings. Apparently, the described embodiments are only part of the embodiments of the present application, not all of the embodiments of the present application. Any other embodiment obtained by those skilled in the art based on the embodiments in the present application without creative efforts shall fall within the protection scope of the present application.

As shown in FIGS. 4, 5, 9, 10, 14, 15, 17, 19, and 21, a mounting bracket for a case according to an embodiment of the present application includes a case-connecting outer wall 106 and a cover-plate-connecting outer wall 107. It can be understood that the case-connecting outer wall is configured to connect to a case inner wall 2, and the cover-plate-connecting outer wall 107 is configured to connect to a cover plate 3.

Specifically, a through hole 101 is formed in the case-connecting outer wall 106. The through hole 101 is configured for a case fixing member 8 of the case inner wall to pass through. It can be understood that the case fixing member 8 is fixed to the case inner wall 2.

According to the mounting bracket for the case provided in the embodiment, the through hole 101 is provided to allow the case fixing member 8 of the case inner wall to pass through. In this way, the case fixing member 8 can be directly fixed in the case body 2 without forming a hole in the case body 2. Therefore, waterproofing can be achieved without providing a seal between the mounting bracket and the case body 2, effectively reducing mounting materials and improving assembly efficiency.

Meanwhile, according to the mounting bracket for the case provided in the present application, the through hole 101 is provided to allow the case fixing member 8 of the case inner wall to pass through, so that the case body 2 and the mounting bracket can be fixed inside the case body 2, the case fixing member 8 and a case connecting member 7 connected to the case fixing member 8 are prevented from being exposed, thereby improving the aesthetics of the entire case. Moreover, compared with providing a threaded hole, that providing the through bole 101 simplifies processing, effectively improves processing efficiency, and reduces processing costs. Since there is no need to provide a seal between the mounting bracket and the case body 2, there is no need to provide a groove to accommodate the seal, which also simplifies the processing, effectively improves the processing efficiency, and reduces the processing costs.

The number of the through hole 101 may be one or more, which can be selected according to actual requirements and not limited in this embodiment. It can be understood that in the case that there is one through hole 101, the through hole 101 is formed in a plane, and the case-connecting outer wall 106 is of a planar structure; in the case that there are at least two through holes 101, the at least two through holes 101 may be selectively arranged in different planes, or any two through holes 101 are located in the same plane. In order to facilitate mounting, at least two through holes 101 may be selected to be provided, and any two through holes 101 are located in the same plane. In this case, the mounting is simplified and the assembly efficiency is improved. Compared with the conventional technology, the sight is prevented from being blocked during the mounting process, which facilitates the mounting.

It can be understood that, in the case that the at least two through holes 101 are respectively provided in different planes, the case-connecting outer wall 106 has at least two planes; in the case that any two through holes 101 are located in the same plane, the case-connecting outer wall 106 is a planar structure.

Figure 12:
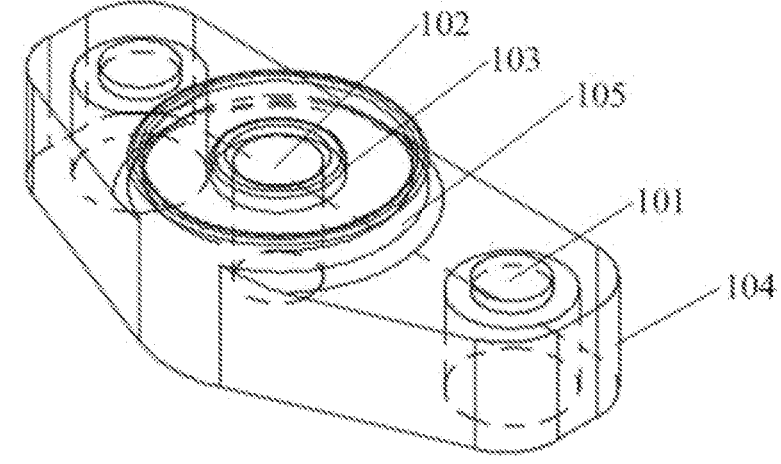
FIG. 12 is a schematic structural diagram of a mounting bracket for a case provided according to Embodiment 3 of the present application.
Figure 13:
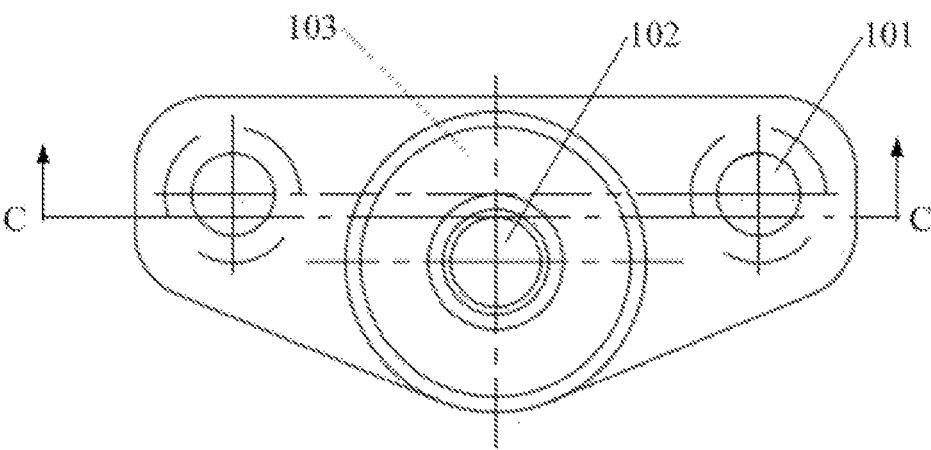
FIG. 13 is a top view of the structure shown in FIG. 12.
Figure 14:
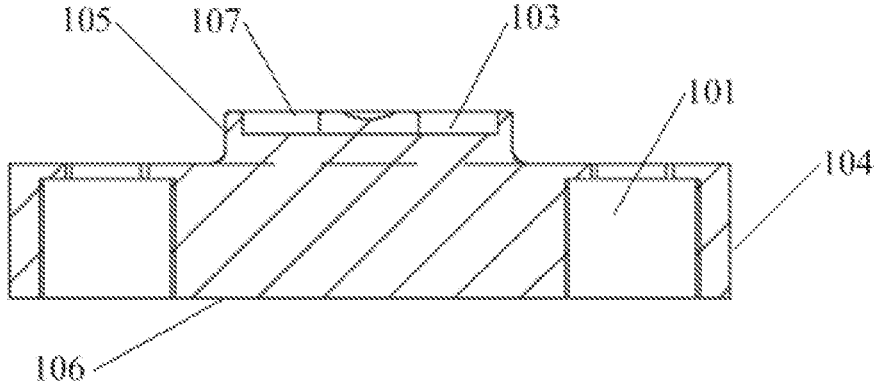
FIG. 14 is a cross-sectional view along line C-C in FIG. 13.
Figure 15:
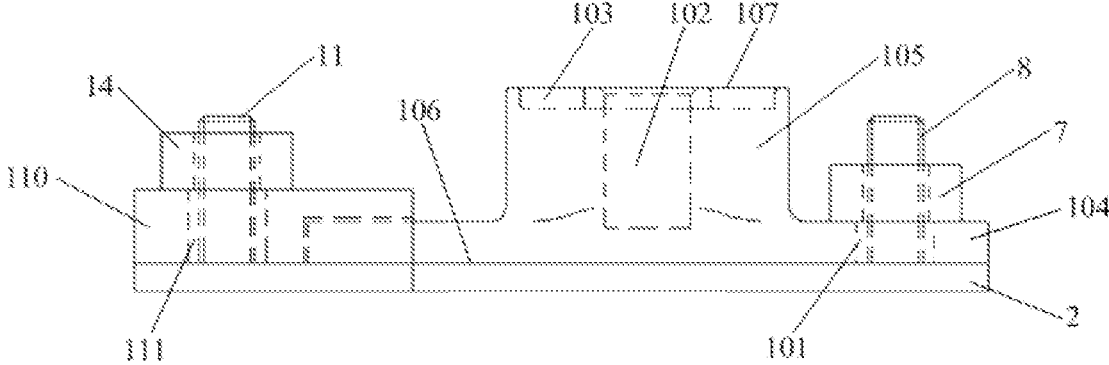
FIG. 15 is a front view of a mounting bracket for a case provided according to Embodiment 4 of the present application.
Figure 16:
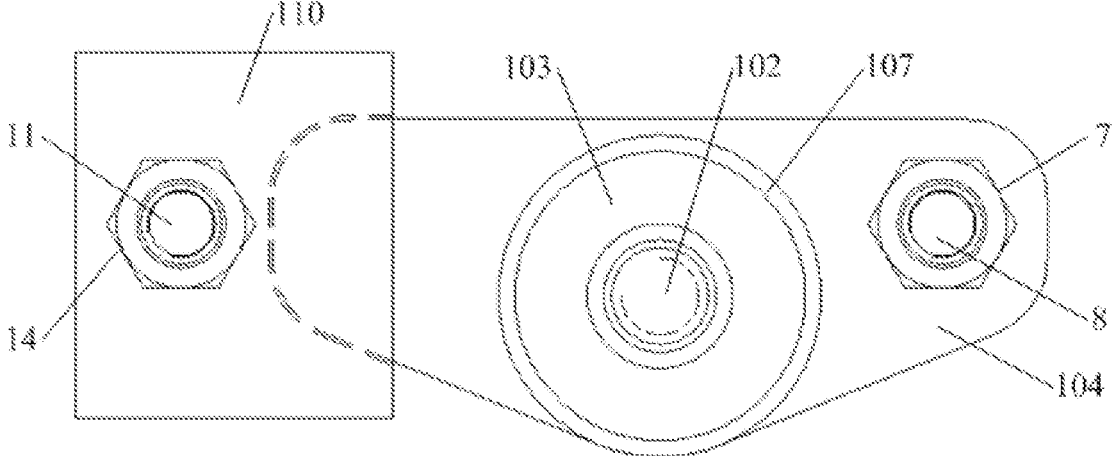
FIG. 16 is a top view of the mounting bracket for a case provided according to Embodiment 4 of the present application.

The size and shape of the through hole 101 may be selected according to actual requirements, for example, according to the case fixing member 8. Specifically, the through hole 101 is a step bole, as shown in FIGS. 12 to 14. Alternatively, the through hole 101 is an equal-diameter bole, as shown in FIGS. 3 to 5 and 8 to 9. In practical applications, the through hole 101 may also be selected as another structure, such as a hole with a diameter gradually changing along an axial direction, which is not limited to the embodiments. In order to improve stability, as shown in FIGS. 15 and 16, the mounting bracket for a case further includes an auxiliary pressing block 110, and the auxiliary pressing block 110 is configured to be fixedly connected to the case inner wall to press the case-connecting outer wall 106 against the case inner wall.

The specific shape and size of the auxiliary pressing block 110 may be selected according to actual requirements, which are not limited in the embodiments.

In order to facilitate the fixed connection between the auxiliary pressing block 110 and the case inner wall, an auxiliary through hole 111 is formed in the auxiliary pressing block 110 for a case auxiliary fixing member 11 of the case inner wall to pass through.

It can be understood that the case auxiliary fixing member 11 is fixed to the case inner wall.

In the above structure, the auxiliary pressing block 110 and the case inner wall are fixedly connected inside the case body, and there is no need to provide a seal between the auxiliary pressing block 110 and the case inner wall for waterproofing, effectively reducing the mounting materials and improving the assembly efficiency.

In order to facilitate mounting, the auxiliary pressing block 110 may be selected to be located at one end of the case-connecting outer wall 106, and the through hole 101 may be located at an end, away from the auxiliary pressing block 110, of the case-connecting outer wall 106.

In practical applications, the relative position of the auxiliary pressing block 110 and the through hole 101 may also be adjusted adaptively, which is not limited in the embodiment.

Figure 17:
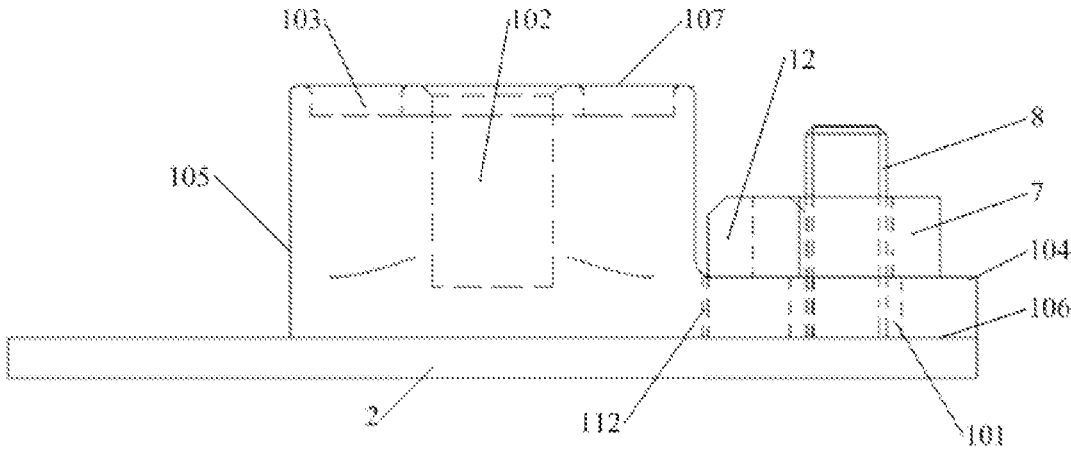
FIG. 17 is a front view of a mounting bracket for a case provided according to Embodiment 5 of the present application.
Figure 18:
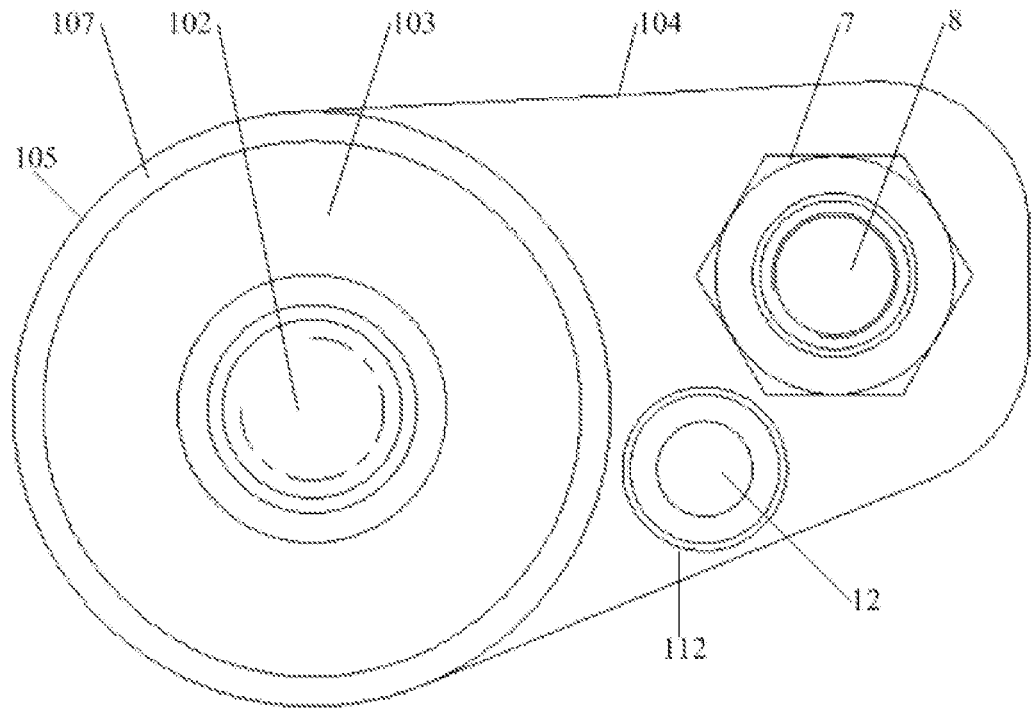
FIG. 18 is a top view of the mounting bracket for a case provided according to Embodiment 5 of the present application.

As shown in FIGS. 17 and 18, the case-connecting outer wall 106 has a positioning structure to be in positioning cooperation with the case inner wall. In this way, it is convenient for the case fixing member 8 to pass through the through hole 101, and it is also convenient for fixed connection.

Specifically, the positioning structure is a positioning hole 112. The positioning hole 112 is configured to be in positioning cooperation with a positioning column 12 on the case inner wall. It can be understood that an axis of the positioning hole 112 and an axis of the through hole 101 are parallel.

In practical applications, the positioning structure may also be selected as a positioning column. The positioning column is configured to be in positioning cooperation with a positioning blind hole on the case inner wall.

Figure 19:
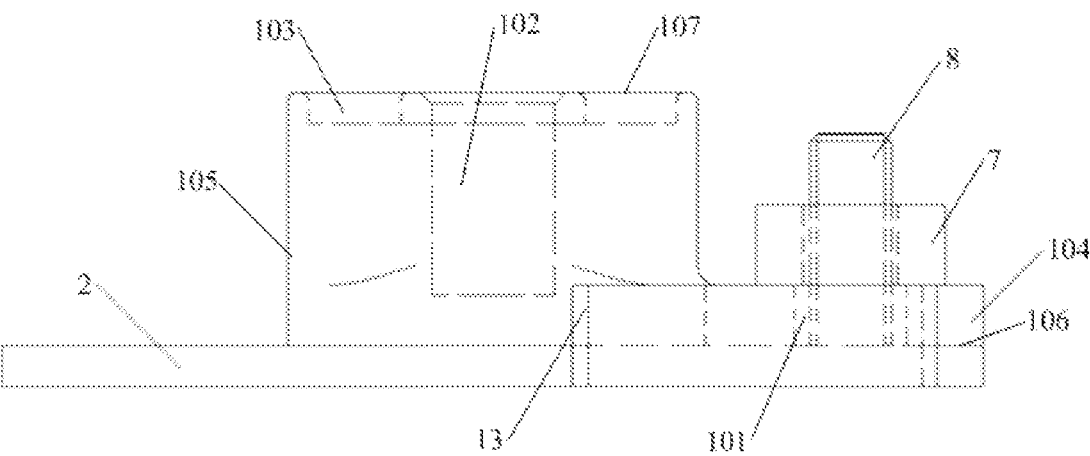
FIG. 19 is a front view of a mounting bracket for a case provided according to Embodiment 6 of the present application.
Figure 20:
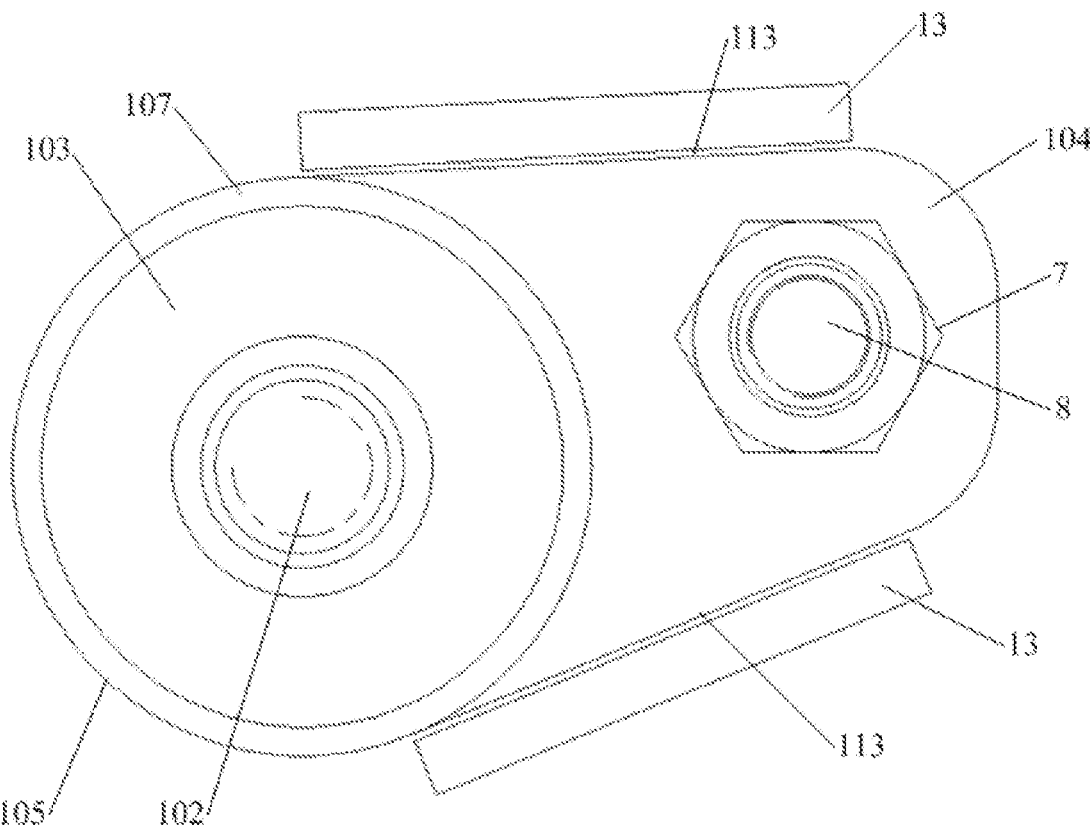
FIG. 20 is a top view of the mounting bracket for a case provided according to Embodiment 6 of the present application.

In the mounting bracket for a case, other manners may also be configured to facilitate mounting. Specifically, as shown in FIGS. 19 and 20, the mounting bracket for a case further includes at least one limiting surface 113. The limiting surface 113 is configured to be in position-limiting cooperation with a limiting member 13 on the case inner wall. The limiting surface 113 is perpendicular to the case-connecting outer wall 106, or there is an included angle between the limiting surface 113 and the case-connecting outer wall 106.

It can be understood that the limiting surface 113 is configured to be fit with the limiting member 13. The limiting member 13 is arranged on the case inner wall.

The number of limiting surface 113 may be one or more, which can be selected according to actual requirements. If there are two limiting surfaces 113, in order to facilitate limiting, the through hole 101 is located between the two limiting surfaces 113.

In the mounting bracket for a case, the cover-plate-connecting outer wall 107 is configured to be connected to the cover plate 3. In order to facilitate connection with the cover plate 3, a mounting hole 102 for fixed connection with the cover plate 3 may be selected to be formed in the cover-plate-connecting outer wall 107, and the cover-plate-connecting outer wall 107 is configured for sealing connection with the cover plate 3.

The mounting hole 102 may be a through hole or a blind hole, which can be selected according to requirements. In order to facilitate sealing, the mounting hole 102 may be selected as a through hole.

The type of the mounting bole 102 is selected according to actual requirements. In order to facilitate fixation, the mounting hole 102 may be selected as a threaded hole. Alternatively, the mounting hole 102 may also be selected as an unthreaded hole, which is not limited to the embodiments.

The number of the mounting hole 102 may be one or more, which may be selected according to requirements and is not limited in the embodiments. In order to simplify the structure, the number of the mounting hole 102 may be selected to be one. In this way, in order to improve stability, the through holes 101 may be arranged symmetrically about the axis of the mounting hole 102. Alternatively, the through hole 101 and the mounting hole 102 may also be arranged in other ways, which is not limited to the embodiments.

The cover-plate-connecting outer wall 107 is configured for sealing connection with the cover plate 3. In order to facilitate sealing, the cover-plate-connecting outer wall 107 may be selected for sealing connection with the cover plate 3 through a mounting bracket seal 4. In order to facilitate the mounting of the mounting bracket seal 4, the cover-plate-connecting outer wall 107 has a mounting groove 103 for mounting the mounting bracket seal 4. The mounting groove 103 is located at a periphery of the mounting hole 102.

Figure 21:
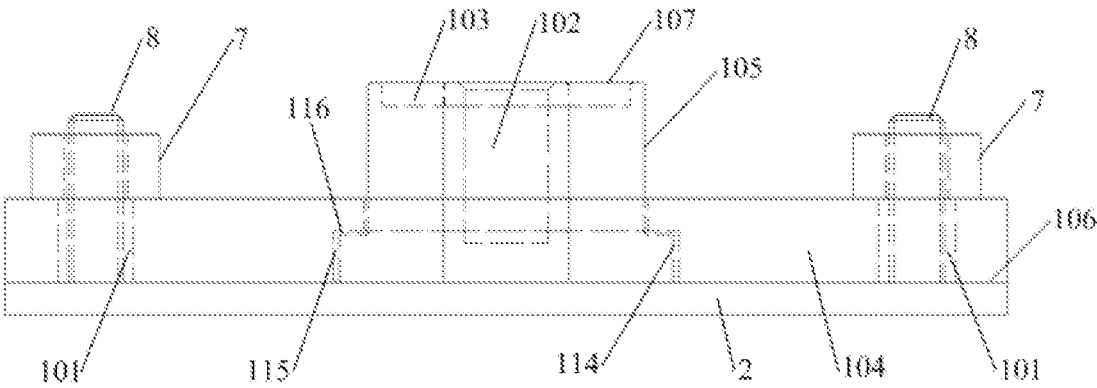
FIG. 21 is a front view of a mounting bracket for a case provided according to Embodiment 7 of the present application.
Figure 22:
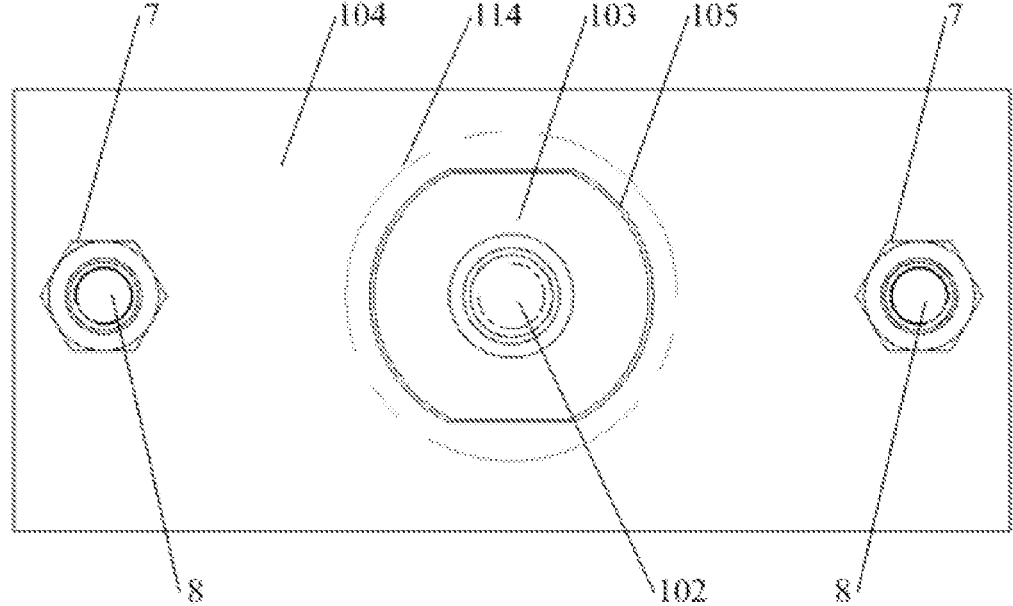
FIG. 22 is a top view of the mounting bracket for a case provided according to Embodiment 7 of the present application.

As shown in FIGS. 21 and 22, the mounting bracket for the case includes: a first mounting part 104 and a second mounting part 105. The cover-plate-connecting outer wall 107 and the mounting hole 102 are located at the second mounting part 105. The case-connecting outer wall 106 and the through hole 101 are located at the first mounting part 104.

The first mounting part 104 and the second mounting part 105 are fixedly connected. Specifically, the first mounting part 104 and the second mounting part 105 are of an integrated structure or a split structure. In the case that the first mounting part 104 and the second mounting part 105 are the split structure, the first mounting part 104 may be selected to be fixedly connected to the case inner wall to press the second mounting part 105 against the case inner wall in order to simplify mounting.

The pressing structure of the first mounting part 104 and the second mounting part 105 may be selected according to actual requirements, which is not limited in the embodiments.

In the mounting bracket for the case, the axis of the mounting hole 102 may be selected to be parallel to the axis of the through hole 101. At this time, the case-connecting outer wall 106 and the cover-plate-connecting outer wall 107 may be arranged in parallel.

In the above structure, the case-connecting outer wall 106 is connected to a second inner wall 202 of the case body. The second inner wall 202 and the cover plate 3 may be arranged in parallel, and the cover-plate-connecting outer wall 107 and the cover plate 3 may be arranged in parallel. In this way, the space for electrical components in the case body 2 is prevented from being occupied, the safety distance is ensured, the size and occupied space of the entire case are reduced, and the cost of the entire case is also reduced.

In the mounting bracket for the case, the number of through hole 101 may be one or more. The relative position relationship between the through hole 101 and the mounting hole 102 can be selected according to actual requirements. To improve stability, the through hole 101 may be selected to be arranged around the periphery of the mounting hole 102. In the case that the mounting bracket for the case has the mounting groove 103, the through hole 101 is also arranged around the periphery of the mounting groove 103. The mounting hole 102 and the through hole 101 may also be arranged in other ways, for example, alternate arrangement, which is not limited to the embodiments.

The specific structure of the mounting bracket for the case may be selected according to actual requirements. Specifically, the mounting bracket for the case includes a first mounting part 104 and a second mounting part 105 that are fixedly connected. The case-connecting outer wall 106 and the through hole 101 are located at the first mounting part 104, and the cover-plate-connecting outer wall 107 and the mounting bole 102 are located at the second mounting part 105. In order to facilitate mounting, the first mounting part 104 is flat-shaped. Alternatively, the first mounting part 104 may also be selected to be of another shape, which is not limited to the embodiments.

It should be noted that the second mounting part 105 is located on one side of the first mounting part 104, the case-connecting outer wall 106 is located on a side of the first mounting part 104 away from the second mounting part 105, and the cover-plate-connecting outer wall 107 is located on a side, away from the first mounting part 104, of the second mounting part 105.

In the above structure, the second mounting part 105 may be selected to be located in the middle of the first mounting part 104, or the second mounting part 105 may be selected to be located at one end of the first mounting part 104, or the second mounting part 105 may be selected to be located at other positions of the first mounting part 104, which is not limited in the embodiments.

Figure 8:
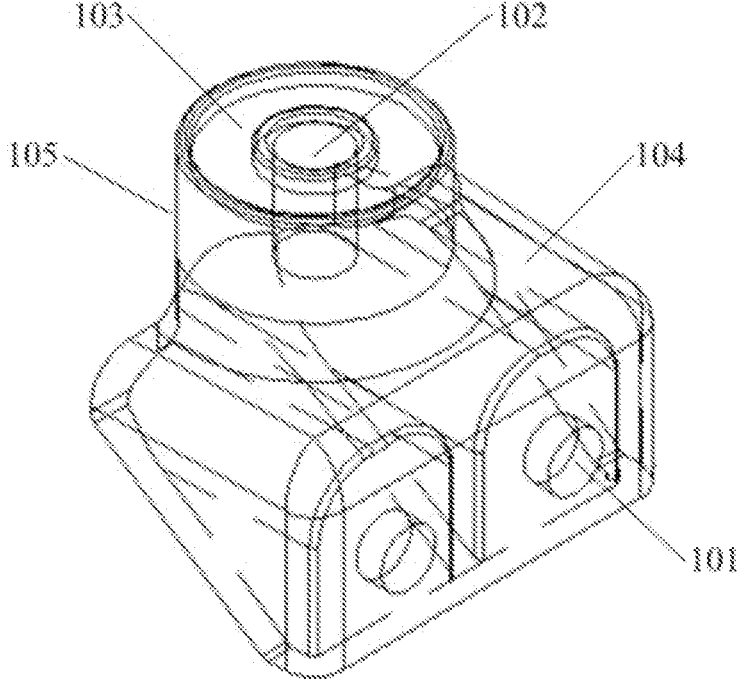
FIG. 8 is a schematic structural diagram of a mounting bracket for a case provided according to Embodiment 2 of the present application.
Figure 9:
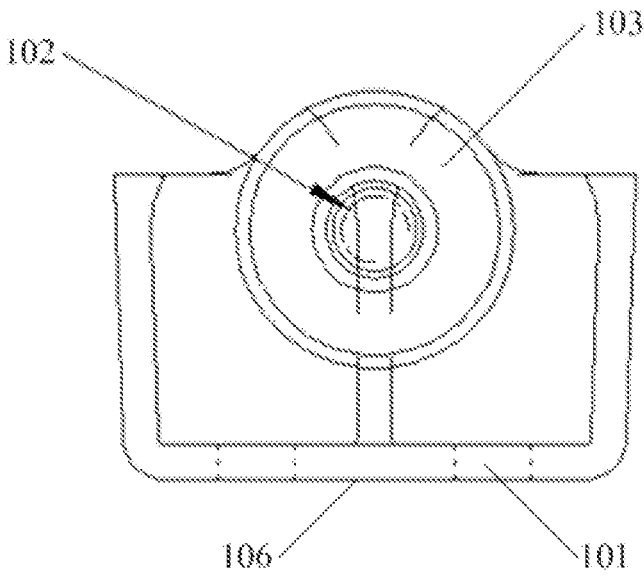
FIG. 9 is a top view of the structure shown in FIG. 8.
Figure 10:
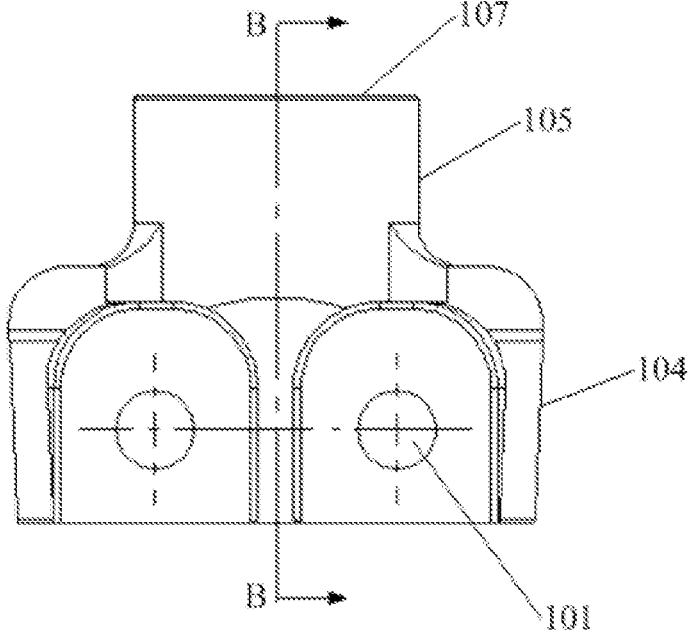
FIG. 10 is a front view of the structure shown in FIG. 8.

The second mounting part 105 may be cylindrical, or may be block-shaped or in other shapes, which may be selected to requirements and is not limited in the embodiments. In the mounting bracket for a case, as shown in FIGS. 8 to 10, the axis of the mounting bole 102 may also be selected to be perpendicular to the axis of the through hole 101. It should be noted that the case-connecting outer wall 106 may be perpendicular to the cover-plate-connecting outer wall 107.

Specifically, the case-connecting outer wall 106 is connected to a first inner wall 201 of the case body. The first inner wall 201 may be perpendicular to the cover plate 3, and the cover-plate-connecting outer wall 107 and the cover plate 3 may be arranged in parallel. In this way, if any two through holes 101 are located in the same plane, the occupation of the space inside the case body 2 can also be reduced to ensure safety distance, the size and occupied space of the entire case are reduced, and the cost of the entire case is also reduced.

If the axis of the mounting hole 102 is perpendicular to the axis of the through hole 101, the mounting bracket for the case may be selected to include a first mounting part 104 and a second mounting part 105 that are fixedly connected. The case-connecting outer wall 106 and the through hole 101 are located at the first mounting part 104, and the cover-plate-connecting outer wall 107 and the mounting hole 102 are located at the second mounting part 105. In order to reduce the occupation of the space inside the case body 2, the second mounting part 105 may be selected to be arranged on one side of the first mounting part 104, and an avoidance structure 108 is formed on a side, away from the second mounting part 105, of the first mounting part 104.

Figure 11:
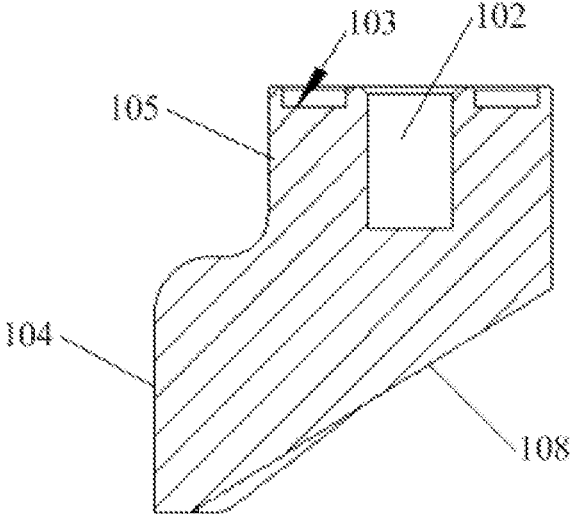
FIG. 11 is a cross-sectional view along line B-B in FIG. 10.

The avoidance structure 108 may be an avoidance inclined surface, an avoidance curved surface, or an avoidance groove, and so on, which can be selected according to actual requirements and is not limited in the embodiments. As shown in FIGS. 10 and 11, the avoidance structure 108 is an avoidance inclined surface.

In the case that the mounting bracket for the case includes the first mounting part 104 and the second mounting part 105, in order to reduce assembly materials, the first mounting part 104 and the second mounting part 105 may be selected to be of an integrated structure. Alternatively, the first mounting part 104 and the second mounting part 105 may also be selected as separate components, and they are fixedly connected through a fixed connection structure.

Figure 23:
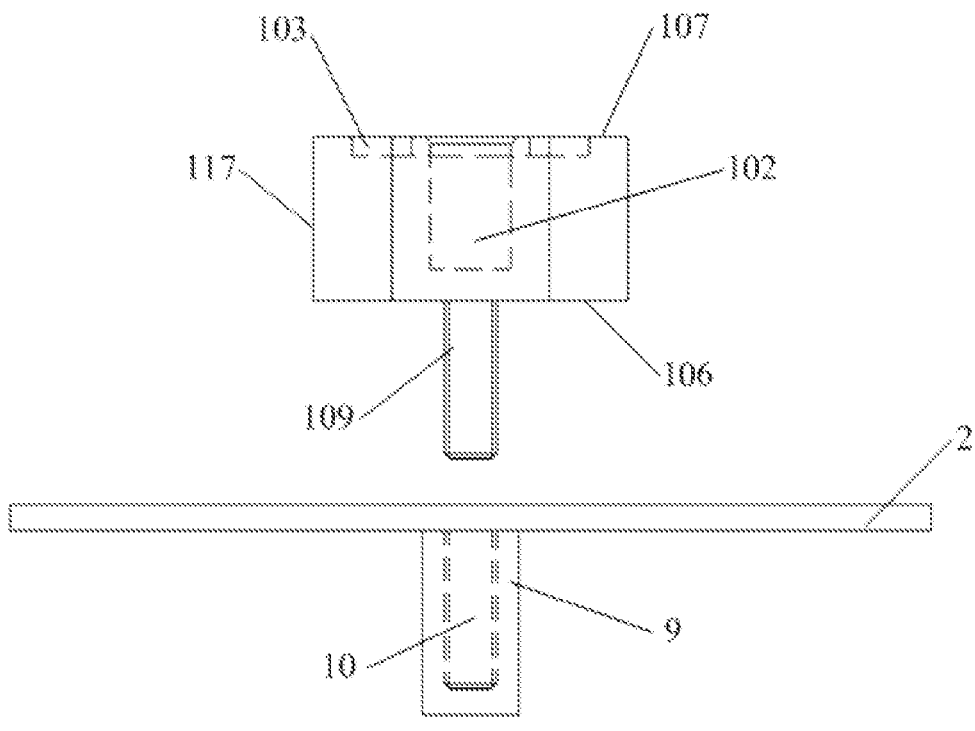
FIG. 23 is a front view of a mounting bracket for a case provided according to Embodiment 8 of the present application.

In the mounting bracket for the case according to the embodiment, the case-connecting outer wall 106 can be fixedly connected to the case inner wall through other structures except the through hole 101. As shown in FIG. 23, a rack fixing member 109 is provided on the case-connecting outer wall 106. The rack fixing member 109 is configured to be fixedly connected to a case blind hole 10 of the case inner wall. It can be understood that the case blind hole 10 is formed at the case inner wall 2.

The specific structures of the rack fixing member 109 and the case blind hole 10 are selected according to actual requirements.

According to the mounting bracket for the case provided in the embodiments, the rack fixing member 109 is provided. The rack fixing member 109 is configured to be fixedly connected to the case blind hole 10 of the case inner wall. In this way, the case blind hole 10 is directly formed at the case inner wall, so that the situation that the through hole is formed at the case inner wall is avoided, waterproofing can be achieved without providing a seal between the mounting bracket and the case body 2, which effectively reduces the mounting materials and improves the assembly efficiency. At the same time, the case body 2 and the mounting bracket can be fixed inside the case body 2, which improves the aesthetics of the entire case. Since there is no need to provide a seal between the mounting bracket and the case body 2, there is no need to provide a groove to accommodate the seal, which simplifies the processing, effectively improves the processing efficiency, and reduces the processing costs.

In order to more specifically embody the technical solutions provided according to the embodiments, three specific embodiments are provided below.

Embodiment 1

As shown in FIGS. 3 to 7, a mounting bracket for a case according to Embodiment 1 includes a first mounting part 104 and a second mounting part 105 that are fixedly connected. A case-connecting outer wall 106 of the first mounting part 104 has a through hole 101, and a cover-plate-connecting outer wall 107 of the second mounting part 105 has a mounting hole 102 and a mounting groove 103.

The first mounting part 104 is of a flat plate shape. The through hole 101 is an equal-diameter hole, and the mounting hole 102 is a threaded blind hole. An axis of the through hole 101 is parallel to an axis of the mounting hole 102. The mounting groove 103 is located on a periphery of the mounting hole 102. The number of through hole 101 is two, and two through holes 101 are symmetrically arranged about the axis of the mounting bole 102.

Figure 5:
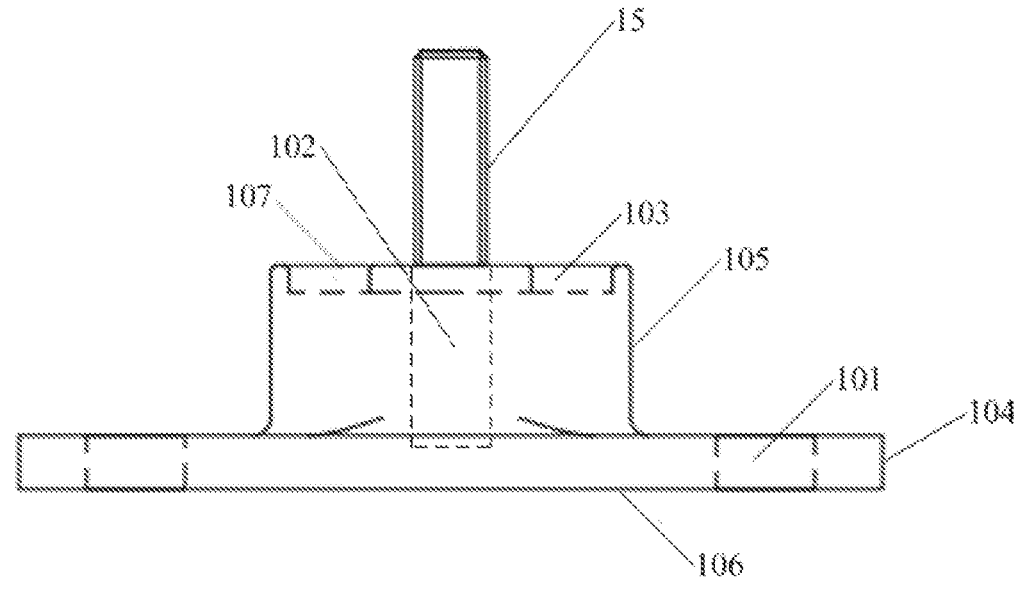
FIG. 5 is a schematic diagram of a cover plate screw stud, in the mounting bracket for a case provided according to Embodiment 1 of the present application, being located in a mounting hole.
Figure 6:
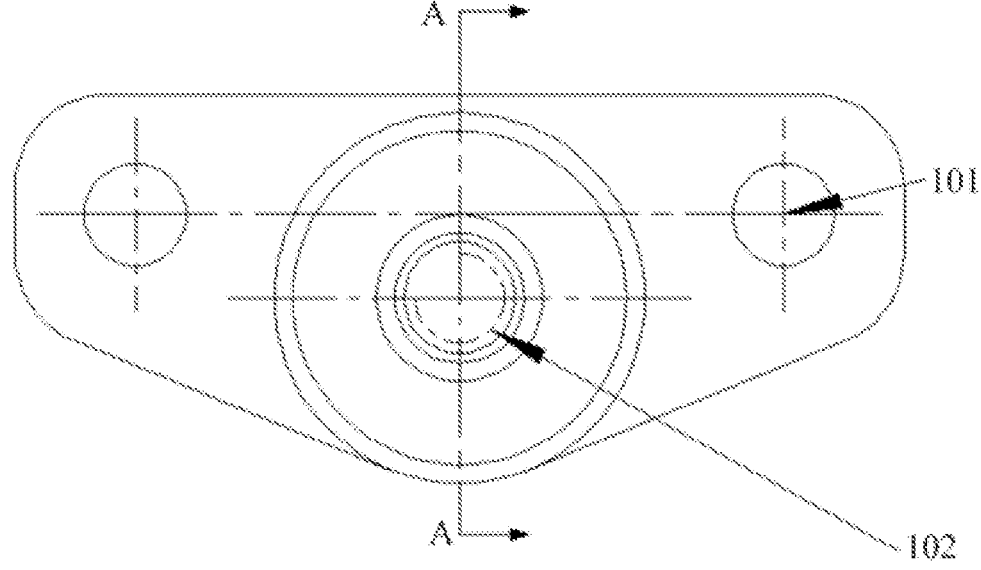
FIG. 6 is a top view of the structure shown in FIG. 3.
Figure 7:
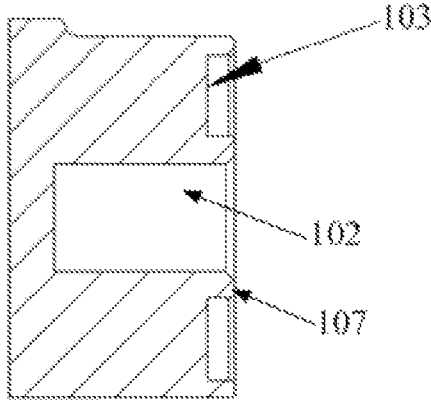
FIG. 7 is a cross-sectional view along line A-A in FIG. 6.

In Embodiment 1, as shown in FIG. 5, the mounting hole 102 is a threaded blind hole, and a cover plate and the mounting bracket for a case are fixedly connected through the cooperation of a cover plate screw stud 15 and a cover plate nut. Specifically, the cover plate has a through hole, and the cover plate screw stud 15 passes through the through hole of the cover plate and enters the mounting hole 102. The cover plate and the mounting bracket can be fixedly connected by tightening the cover plate nut in threaded cooperation with the cover plate screw stud 15.

Figure 27:
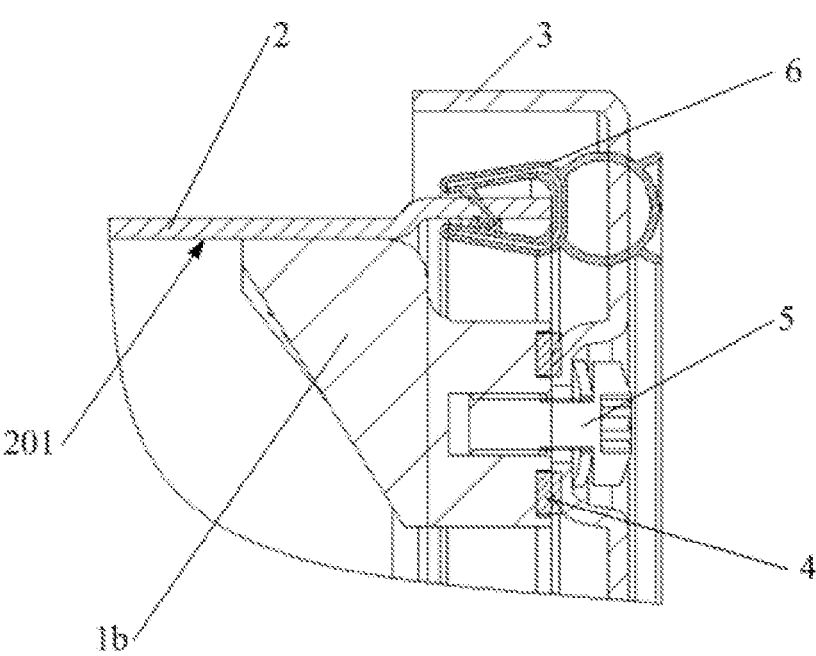
FIG. 27 is a partial enlarged view of the structure shown in FIG. 26.
Figure 28:
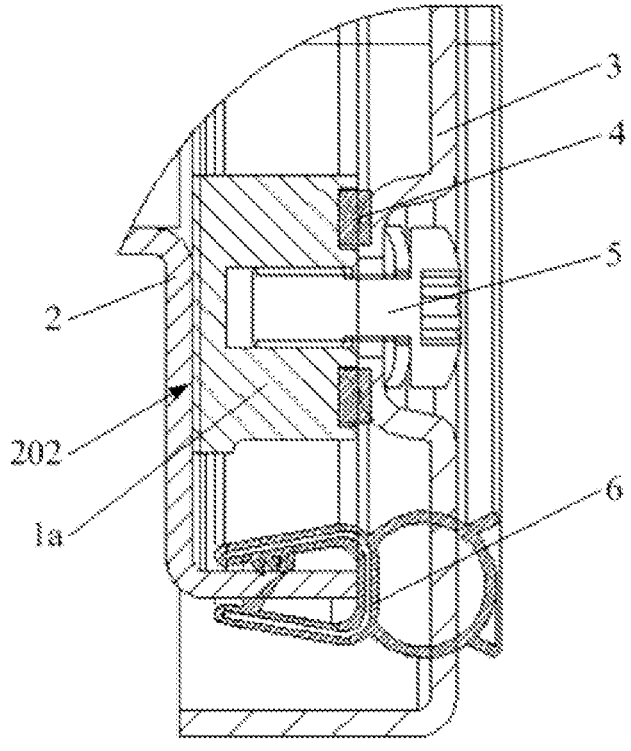
FIG. 28 is a partial enlarged view of the structure shown in FIG. 26.

In practical applications, the cover plate screw stud 15 and the cover plate nut may be replaced with a cover plate screw 5, as shown in FIGS. 27 and 28. Specifically, the cover plate screw 5 passes through the cover plate 3 and enters the mounting hole 102. The cover plate 3 and the mounting bracket can be fixedly connected by tightening the cover plate screw 5.

Embodiment 2

As shown in FIGS. 8 to 11, a mounting bracket for a case according to Embodiment 2 includes a first mounting part 104 and a second mounting part 10S that are fixedly connected. A case-connecting outer wall 106 of the first mounting part 104 has a through hole 101, and a cover-plate-connecting outer wall 107 of the second mounting part 105 has a mounting hole 102 and a mounting groove 103.

The second mounting part 105 is located on one side of the first mounting part 104, and an avoidance structure 108 is formed on a side, away from the second mounting part 105, of the first mounting part 104. Specifically, the avoidance structure 108 is an avoidance inclined surface.

The through hole 101 is an equal-diameter hole, and the mounting hole 102 is a threaded blind hole. An axis of the through hole 101 is perpendicular to an axis of the mounting hole 102. The mounting groove 103 is located on a periphery of the mounting bole 102. The number of through hole 101 is two, and two through holes 101 are symmetrically arranged about the axis of the mounting hole 102.

Embodiment 3

As shown in FIGS. 12 to 14, a mounting bracket for a case according to Embodiment 3 differs from the mounting bracket for a case according to Embodiment 1 in that the through hole 101. In Embodiment 3, the through hole 101 is a step hole. It can be understood that a large end of the step hole is located at the case-connecting outer wall 106.

Other structures of the mounting bracket for the case according to Embodiment 3 can refer to Embodiment 1, which is not repeated in Embodiment 3.

Embodiment 4

As shown in FIGS. 15 and 16, a mounting bracket for a case according to Embodiment 4 includes a first mounting part 104, a second mounting part 105, and an auxiliary pressing block 110.

The first mounting part 104 and the second mounting part 105 are of an integrated structure. An end, away from the second mounting part 105, of the first mounting part 104 has a case-connecting outer wall 106, and an end, away from the first mounting part 104, of the second mounting part 105 has a cover-plate-connecting outer wall 107.

The case-connecting outer wall 106 has a through hole 101, that is, the first mounting part 104 has the through hole 101. The through bole 101 is configured for a case fixing member 8 on a case inner wall to pass through. Specifically, the case body and the mounting bracket for a case are fixedly connected through fixed connection between a case connecting member 7 and the case fixing member 8.

The case fixing member 8 is a screw, and the case connecting member 7 is a nut that is in threaded cooperation with the screw.

The cover-plate-connecting outer wall 107 has a mounting hole 102 for being fixedly connected to the cover plate, and the cover-plate-connecting outer wall 107 is configured for sealing connection with the cover plate.

The second mounting part 105 is located in the middle of the first mounting part 104, the through hole 101 is located on one side of the second mounting part 105, and the auxiliary pressing block 110 is located on the other side of the second mounting part 105.

The auxiliary pressing block 110 is configured to be fixedly connected to the case inner wall to press the case-connecting outer wall 106 against the case inner wall. Specifically, the auxiliary pressing block. 110 is configured to be fixedly connected to the case inner wall to press the first mounting part 104 against the case inner wall.

In order to facilitate mounting, the auxiliary pressing block 110 has an auxiliary through hole 111 for a case auxiliary fixing member 11 of the case inner wall to pass through. Specifically, the auxiliary pressing block 110 and the case 2 are fixedly connected through the fixed connection of a case auxiliary connecting member 14 and the case auxiliary fixing member 11.

The case auxiliary fixing member 11 is a screw, and the case auxiliary connecting member 14 is a nut that is in threaded cooperation with the screw.

The numbers of through hole 101 and auxiliary through hole 111 may be selected according to actual requirements, which are not limited in Embodiment 4.

Other structures of the mounting bracket for the case according to Embodiment 4 can refer to the previous description, which are not repeated in Embodiment 4.

It should be noted that the case 2 is not shown in FIG. 16.

Embodiment 5

As shown in FIGS. 17 and 18, a mounting bracket for a case according to Embodiment 5 includes a first mounting part 104 and a second mounting part 105.

The first mounting part 104 and the second mounting part 105 are of an integrated structure. An end, away from the second mounting part 105, of the first mounting part 104 has a case-connecting outer wall 106, and an end, away from the first mounting part 104, of the second mounting part 105 has a cover-plate-connecting outer wall 107.

The case-connecting outer wall 106 has a through hole 101 and a positioning hole 112, that is, the first mounting part 104 has the through hole 101 and the positioning hole 112.

The through hole 101 is configured for a case fixing member 8 on the case inner wall to pass through. Specifically, the case body 2 and the mounting bracket for the case are fixedly connected through fixed connection between a case connecting member 7 and a case fixing member 8. In an embodiment, the case fixing member 8 is a screw, and the case connecting member 7 is a nut that is in threaded cooperation with the screw.

The positioning hole 112 is configured to be in positioning cooperation with a positioning column 12 on the case inner wall. In order to facilitate mounting, an axis of the positioning hole 112 and an axis of the through hole 101 are parallel. It can be understood that the positioning column 12 is fixed to the case inner wall.

The positioning hole 112 and the through hole 101 are located on the same side of the second mounting part 105. Alternatively, the positioning hole 112 and the through hole 101 may also be located on opposite sides of the second mounting part 105, that is, the positioning hole 112 is located on one side of the second mounting part 105, and the through hole 101 is located on the other side of the second mounting part 105.

In the case that the second mounting part 105 is located at one end of the first mounting part 104, preferably, the positioning hole 112 and the through hole 101 are located on the same side of the second mounting part 105.

The cover-plate-connecting outer wall 107 has a mounting hole 102 for fixed connection with the cover plate, and the cover-plate-connecting outer wall 107 is configured for sealing connection with the cover plate.

The number of through hole 101 and positioning hole 112 are selected according to actual requirements, which are not limited in Embodiment 5.

Other structures of the mounting bracket for the case according to Embodiment 5 can refer to the previous description, which are not repeated in Embodiment 5.

It should be noted that the case 2 is not shown in FIG. 18.

Embodiment 6

As shown in FIGS. 19 and 20, the main difference between Embodiment 6 and Embodiment 5 is that the case-connecting outer wall 106 does not have a positioning hole, the mounting bracket for the case further has at least one limiting surface 113, and the at least one limiting surface 113 is configured to be in position-limiting cooperation with a limiting member 13 on the case inner wall. It can be understood that the limiting surface 113 is configured to contact and fit the limiting member 13. The limiting member 13 is arranged on the case inner wall.

Specifically, the limiting surface 113 is a side surface of the first mounting part 104, and the limiting surface 113 is perpendicular to the case-connecting outer wall 106.

The number of limiting surface 113 may be one or more, which can be selected according to actual requirements. In order to improve the limit effect, the number of limiting surface 113 is two. In this way, the number of limiting member 13 on the case inner wall may be selected to be two, and two limiting members 13 are in one-to-one correspondence with two limiting surfaces 113. Alternatively, the number of limiting member 13 on the case inner wall may also be selected to be one, which is not limited to the embodiment.

In order to facilitate position limiting, the through hole 101 is located between the two limiting surfaces 113.

Shapes of the limiting surface 113 and the limiting member 13 may be selected according to actual requirements. For example, the limiting surface 113 is a plane, and the limiting member 13 is of a cuboid, which are not limited in Embodiment 6.

The numbers of limiting surface 113 and limiting member 13 are also selected according to actual requirements, which are not limited in Embodiment 6.

Other structures of the mounting bracket for a case according to Embodiment 6 can refer to the previous description, which are not repeated in Embodiment 6.

It should be noted that the case 2 is not shown in FIG. 20.

Embodiment 7

As shown in FIGS. 21 and 22, the main difference between Embodiment 7 and Embodiment 1 is that the first mounting part 104 and the second mounting part 105 are of a split structure, and the first mounting part 104 is fixedly connected to the case inner wall to press the second mounting part 105 against the case inner wall.

Specifically, an end, away from the cover-plate-connecting outer wall 107, of the second mounting part 105 has a crimping flange 114. The first mounting part 104 has a crimping step hole 115, the first mounting part 104 is mounted outside the second mounting part 105 through the crimping step hole 115 of the first mounting part 104, and a step surface 116 of the crimping step hole 115 is pressed against the crimping flange 114.

It can be understood that a large end of the crimping step hole 115 is located on the case-connecting outer wall 106, and a small end of the crimping step hole 115 is away from the case-connecting outer wall 106. The crimping flange 114 cooperates with the large end of the crimping step hole 115. The number of step surface 116 of the crimping step hole 115 may be one or more. In the case that the number of step surface 116 is more than two, any two step surfaces 116 are sequentially distributed along an axial direction of the crimping step hole 115.

In practical applications, optionally, the number of first mounting part 104 is at least two, and at least two first mounting parts 104 are sequentially distributed along a circumferential direction of the crimping flange 114. The first mounting part 104 is mounted outside the crimping flange 114, which is not limited to the mounting structure.

The case-connecting outer wall 106 has a through hole 101, that is, the first mounting part 104 has the through hole 101. The through hole 101 is configured for a case fixing member 8 on the case inner wall to pass through. Specifically, the case body 2 and the mounting bracket for the case are fixedly connected through the fixed connection between a case connecting member 7 and the case fixing member 8.

The case fixing member 8 is a screw, and the case connecting member 7 is a nut that is in threaded cooperation with the screw.

Other structures of the mounting bracket for the case according to Embodiment 7 can refer to the previous description, which are not repeated in Embodiment 7.

Embodiment 8

Figure 24:
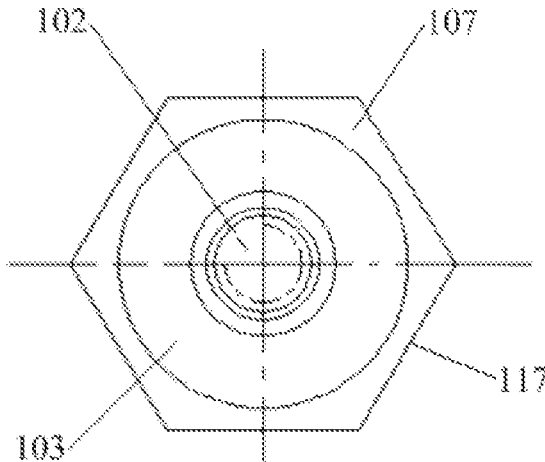
FIG. 24 is a top view of the mounting bracket for a case provided according to Embodiment 8 of the present application.
Figure 25:
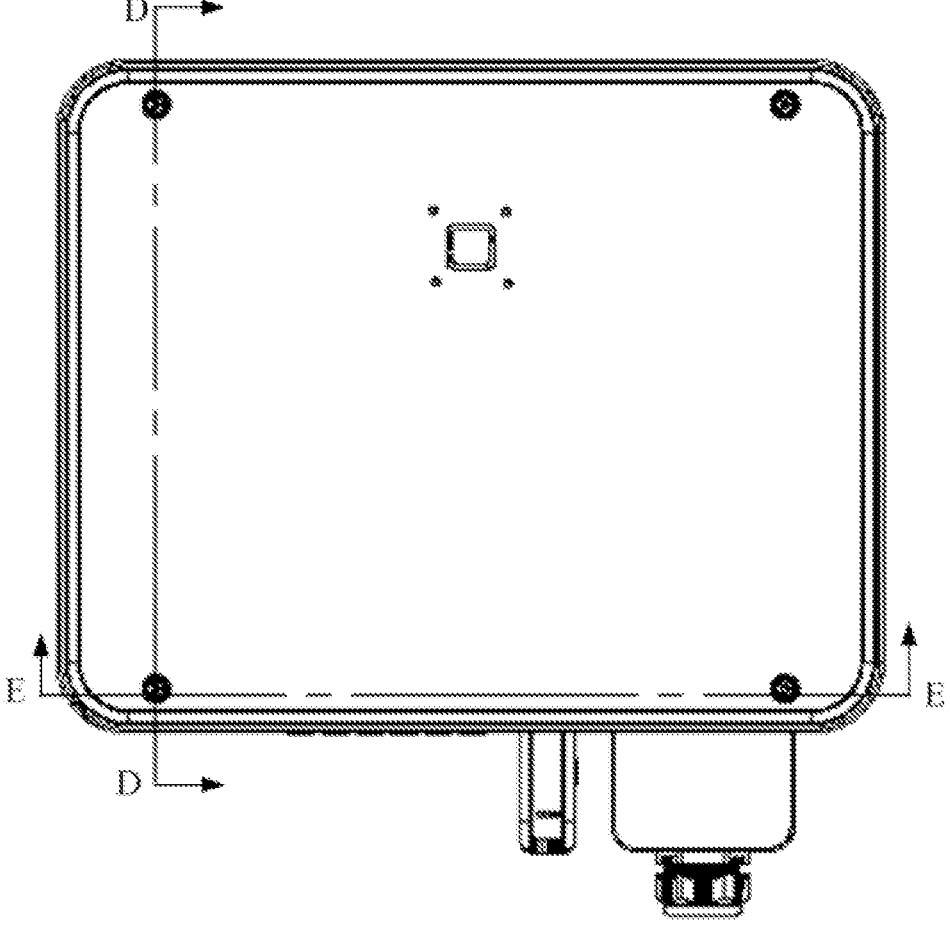
FIG. 25 is a schematic structural diagram of a case provided according to an embodiment of the present application.
Figure 26:
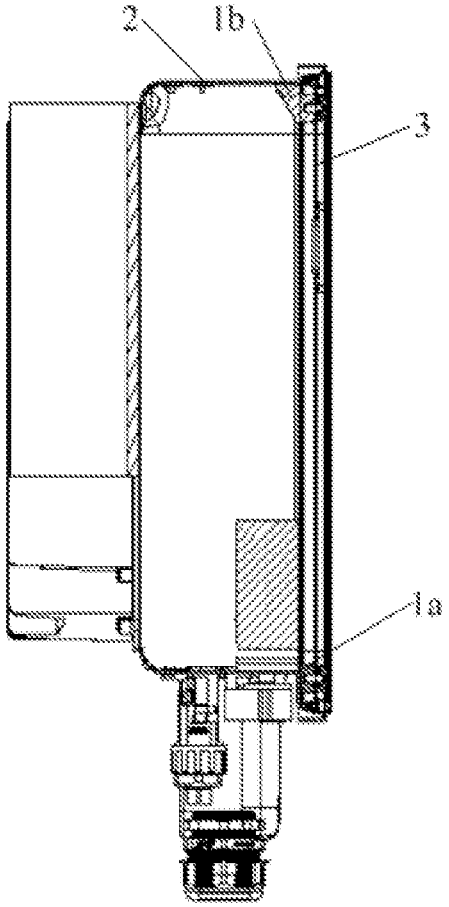
FIG. 26 is a cross-sectional view along line D-D in FIG. 25.

As shown in FIGS. 23 and 24, a mounting bracket for a case according to Embodiment 8 includes a case-connecting outer wall 106 and a cover-plate-connecting outer wall 107. It can be understood that the case-connecting outer wall 106 is configured to be connected to the case inner wall of the case body 2, and the cover-plate-connecting outer wall 107 is configured to be connected to the cover plate 3.

Specifically, the case-connecting outer wall 106 is provided with a rack fixing member 109, and the rack fixing member 109 is configured to be fixedly connected to a case blind hole 10 of the case inner wall. It can be understood that the case blind hole 10 is formed at the case inner wall.

The specific structures of the rack fixing member 109 and the case blind bole 10 are selected according to actual requirements. In order to facilitate fixation, the rack fixing member 109 is a screw stud, and the case blind hole 10 is a threaded hole. Furthermore, the mounting bracket for a case is a mounting column 117, and the rack fixing member 109 is located at one end of the mounting column 117, and the cross section of the mounting column 117 is of a regular hexagon. It can be understood that the cross section of the mounting column 117 is perpendicular to an axial direction of the mounting column 117. In this way, it is convenient to tighten the rack fixing member 109 to the case blind hole 10.

In practical applications, other hexagonal structures may also be provided on the mounting bracket for a case to facilitate tightening the rack fixing member 109 to the case blind hole 10. Alternatively, the rack fixing member 109 and the case blind hole 10 may be fixedly connected by other means, for example, the rack fixing member 109 is bonded in the case blind hole 10, which is not limited to the embodiment.

One end face of the mounting column 117 is the case-connecting outer wall 106, and the other end face of the mounting column 117 is the cover-plate-connecting outer wall 107. The cover-plate-connecting outer wall 107 has a mounting hole 102 and a mounting groove 103. The mounting hole 102 is configured for fixed connection with the cover plate, and the mounting groove 103 is configured for mounting a mounting bracket seal 4 that is sealingly connected to the cover plate and the cover-plate-connecting outer wall 107.

Other structures of the mounting bracket for the case according to Embodiment 8 can refer to the previous description, which are not repeated in Embodiment 8.

It should be noted that the case 2 is not shown in FIG. 24.

Based on the mounting bracket for the case according to the above embodiments, the case is also provided according to the embodiments. The case includes: a case body 2, a cover plate 3, and a mounting bracket. The mounting bracket is the mounting bracket for a case described in the above embodiments.

Specifically, in the case that the case-connecting outer wall 106 has a through hole 101 for a case fixing member 8 of the case inner wall to pass through, and the case inner wall of the case body 2 is fixed with the case fixing member 8. The case further includes a case connecting member 7. The case connecting member 7 is fixedly connected to the case fixing member 8 to fixedly connect the mounting bracket to the case body 2. In the case that the case-connecting outer wall 106 has a rack fixing member 109 for fixed connection with a case blind hole 10 of the case inner wall, and the case inner wall of the case body 2 has the case blind hole 10. Since the mounting bracket for a case according to the embodiments has the above technical effects, and the case includes the mounting bracket for a case, the case also has corresponding technical effects, which is not repeated herein.

In the case, the number of mounting bracket may be one or more. In order to improve stability, the number of mounting bracket may be selected to be two or more. In this case, the structures of any two mounting brackets may be the same, or at least two mounting brackets have different structures.

Specifically, the number of mounting bracket is at least two, at least one mounting bracket is a first mounting bracket 1a, and at least one mounting bracket is a second mounting bracket 1b. An axis of the through hole 101 in the first mounting bracket 1a is parallel to an axis of the mounting hole 102, and an axis of the through hole 101 in the second mounting bracket 1b is perpendicular to the axis of the mounting hole 102.

As shown in FIGS. 25, 26, 31, 32, and 35, the number of first mounting bracket 1a and the number of second mounting bracket 1b are two. In practical applications, structures and numbers of mounting brackets may also be selected according to the specific structure of the case body 2, which are not limited to the embodiments.

Figure 36:
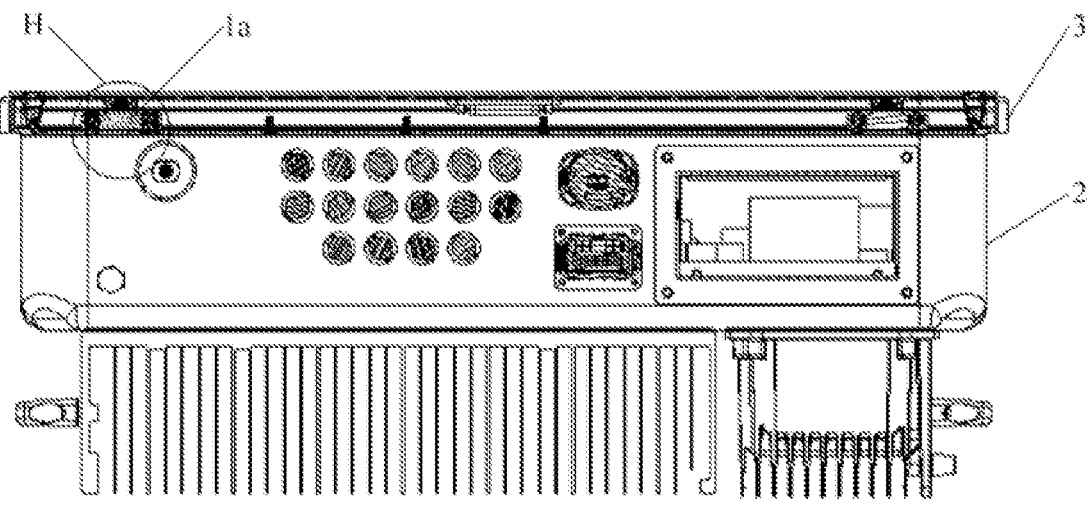
FIG. 36 is a cross-sectional view of another structure of a case provided according to an embodiment of the present application.
Figure 37:
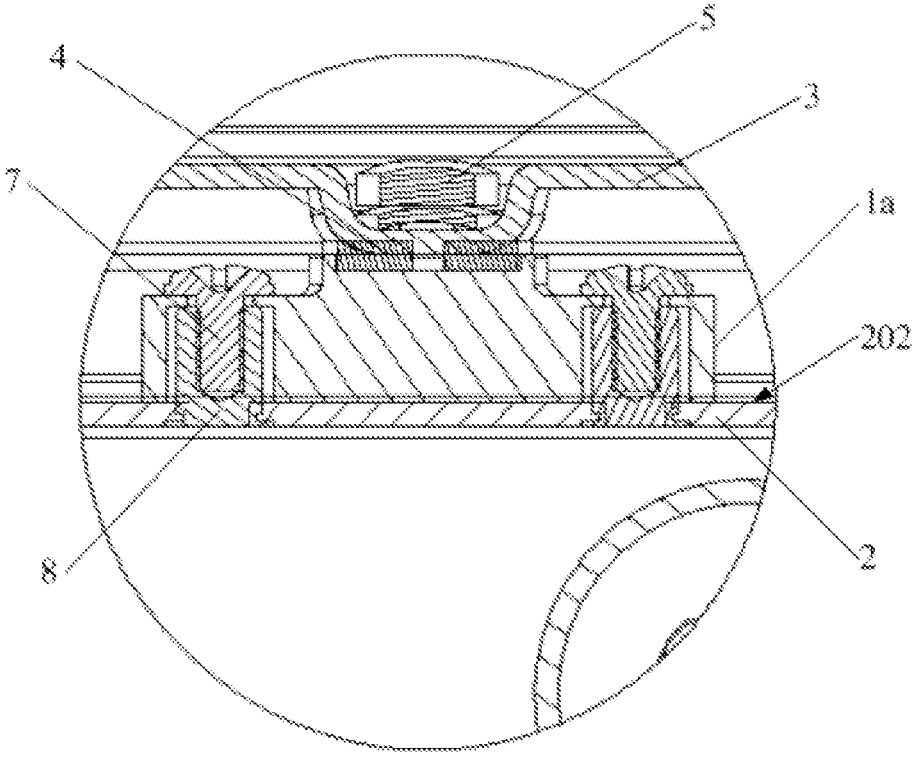
FIG. 37 is an enlarged view of part H in FIG. 36.

In the case, the specific types of the case fixing member 8 and the case connecting member 7 may be selected according to actual requirements. In an embodiment, the case fixing member 8 is a fixing column, the fixing column has a threaded hole, and the case connecting member 7 is a screw that is in threaded cooperation with the threaded hole, as shown in FIGS. 36 and 37. In this way, the through hole 101 may be selected as a step hole to facilitate the mounting of the case connecting member 7.

Figure 29:
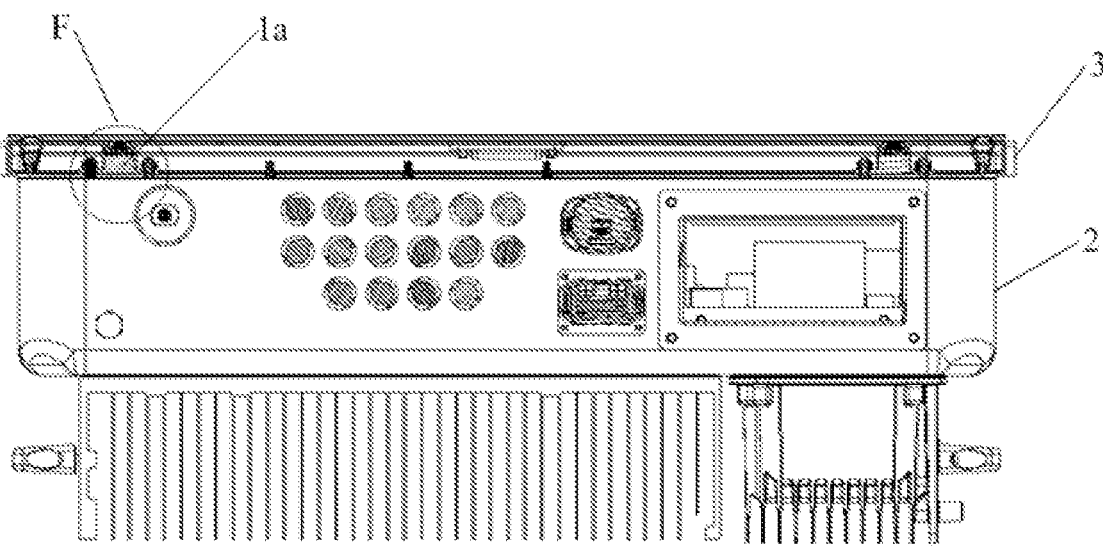
FIG. 29 is a cross-sectional view along line E-E in FIG. 25.
Figure 30:
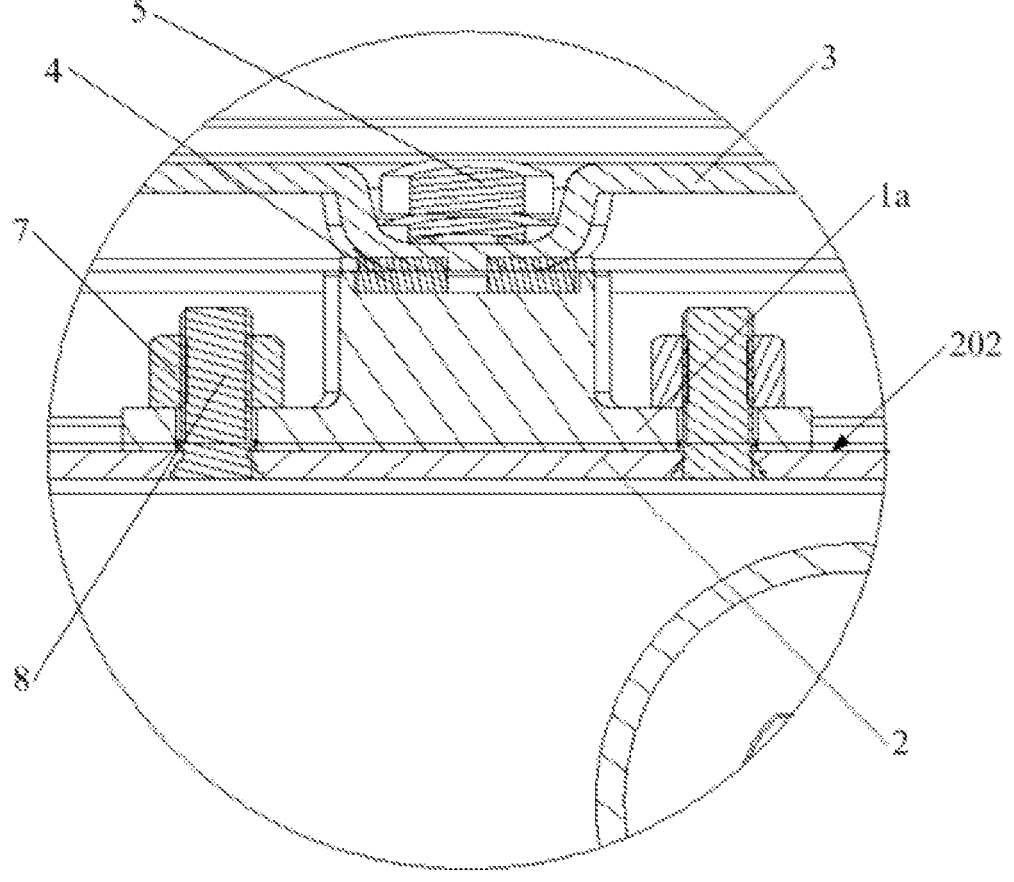
FIG. 30 is an enlarged view of Part F in FIG. 29.
Figure 31:
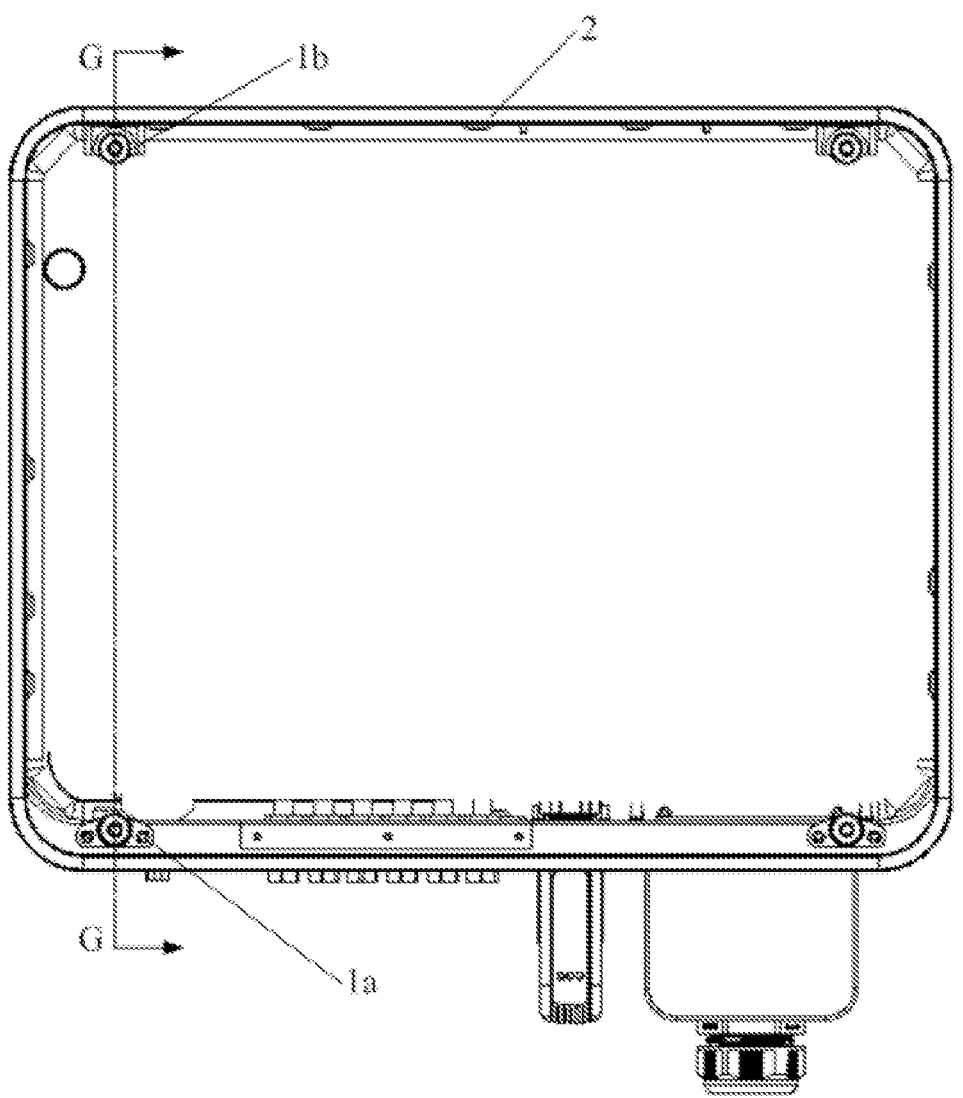
FIG. 31 is a schematic diagram of an assembly of a case body and a mounting bracket in the case shown in FIG. 25.
Figure 32:
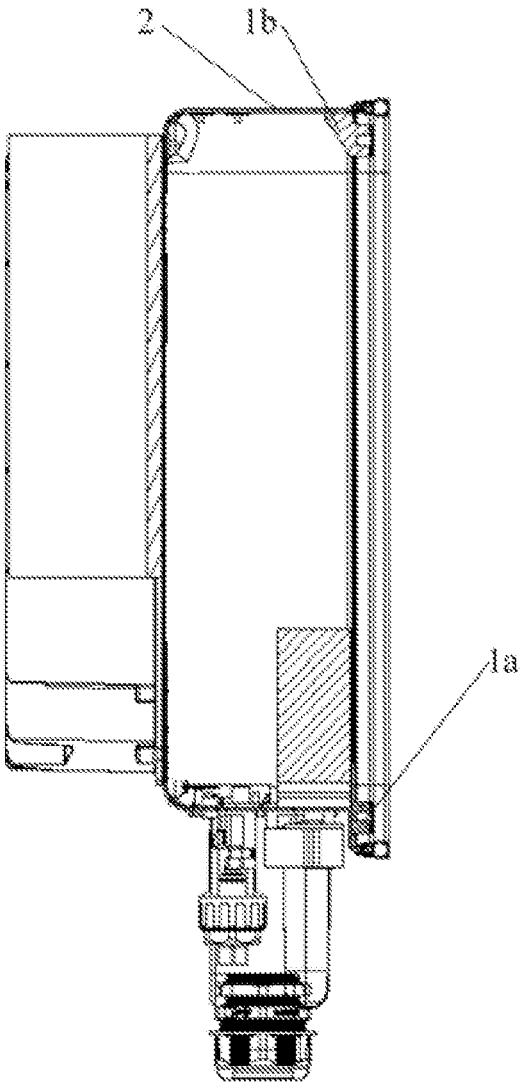
FIG. 32 a cross-sectional view along line G-G in FIG. 31.
Figure 33:
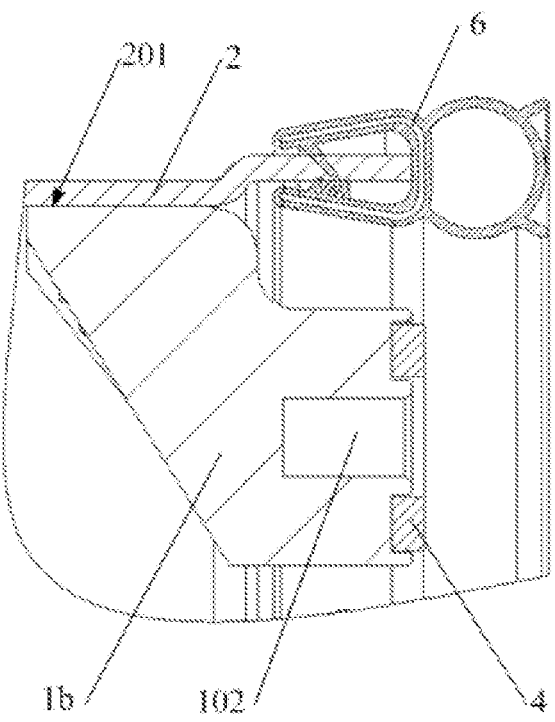
FIG. 33 is a partial enlarged view of the structure shown in FIG. 32.
Figure 34:
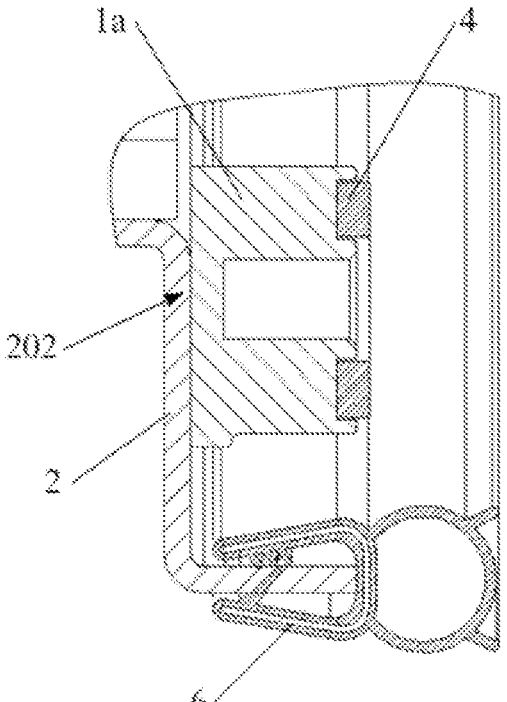
FIG. 34 is a partial enlarged view of the structure shown in FIG. 32.
Figure 35:
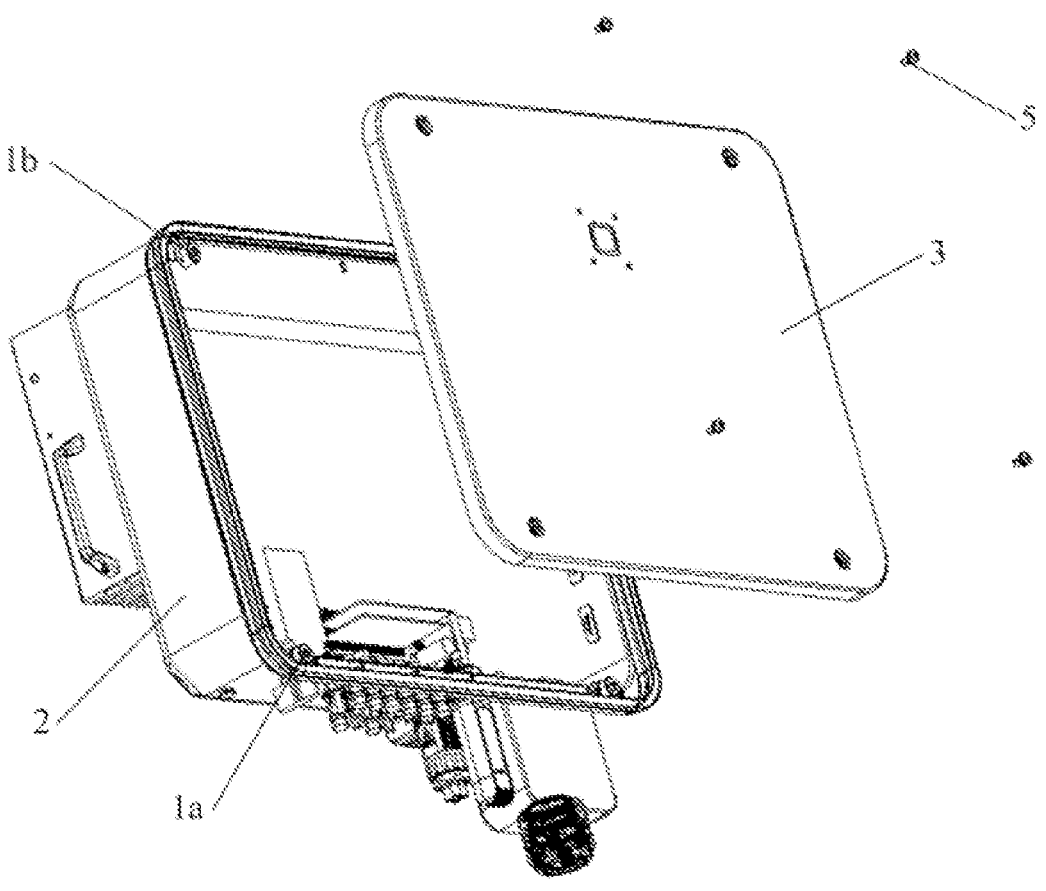
FIG. 35 is a schematic diagram of an assembly of the case body and a cover plate in the case shown in FIG. 25.

In practical applications, the case fixing member 8 may also be selected as a screw, and the case connecting member 7 is a nut that in threaded cooperation with the screw, as shown in FIG. 29 and FIG. 30. The through hole 101 may be selected as an equal-diameter hole to facilitate the mounting of the case connecting member 7.

It should be noted that FIGS. 30 and 37 show a case fixing member 8 and a case connecting member 7 used in cooperation with the first mounting frame 1a. A case fixing member 8 and a case connecting member 7 used in cooperation with the second mounting frame 1b can refer to the above description, which is not repeated herein.

In the case, in order to facilitate the arrangement of the case fixing member 8, the case fixing member 8 may be pressed and riveted to the case body 2. Alternatively, the case fixing member 8 may also be welded to the case body, which is not limited to the embodiments.

In the case, in the case that the mounting hole 102 is a threaded hole, the cover plate screw 5 may be fixedly connected to the cover plate 3 and the mounting bracket. Specifically, the cover plate 3 has a through hole, and the cover plate screw 5 passes through the cover plate 3 and enters the mounting hole 102. The cover plate 3 and the mounting bracket can be fixedly connected by the tightening of the cover plate screw 5.

In the case, in order to improve the protective performance, a cover plate seal 6 is usually provided to be sealingly connected to the case body 2 and the cover plate 3. The cover plate seal 6 is located on the periphery of the mounting bracket, and the mounting bracket is located on an inner side of the cover plate seal 6. It should be noted that the inner side of the cover plate seal 6 refers to a side, facing the interior of the case body 3, of the cover plate seal 6.

In the case, if the case-connecting outer wall 106 has a rack fixing member 109 for fixed connection with a case blind hole 10 of the case inner wall, the case inner wall of the case body 2 has the case blind hole 10. In order to facilitate the arrangement of the case blind hole 10, as shown in FIG. 23, a case fixing column 9 is fixed to the case inner wall of the case body 2, and the case blind hole 10 is formed in the case fixing column 9. In order to ensure the sealing performance, the case fixing column 9 is sealingly connected to the case inner wall.

In order to facilitate fixation, the case fixing column 9 may be pressed and riveted to the case inner wall. Alternatively, the case fixing column 9 may also be fixed to the case inner wall by other means, which is not limited to the embodiments.

The case fixing column 9 may extend towards a side, close to the mounting bracket, of the case inner wall, or extend towards a side, away from the mounting bracket, of the case inner wall. As shown in FIG. 23, preferably, the case fixing column 9 extends towards the side of the case inner wall away from the mounting bracket. In this way, the structural compactness is improved.

Based on the case according to the embodiments, an electrical device is also provided according to the embodiments. The electrical device includes the case described in the embodiments.

Since the case according to the embodiments has the above technical effects, and the electrical device includes the case, the electrical device also has corresponding technical effects, which is not repeated herein.

The above description of the embodiments enables those skilled in the art to implement or use the present application. Various modifications to the embodiments are apparent to those skilled in the art. General principles defined herein may be implemented in other embodiments without departing from spirits or scopes of the present application. Therefore, the present application is not limited to the embodiments shown herein, but is to be accorded the widest scope consistent with the principles and novel features disclosed herein.

What is claimed is:

1. A mounting bracket for a case, comprising a case-connecting outer wall and a cover-plate-connecting outer wall, wherein the case-connecting outer wall has a through hole for a case fixing member of a case inner wall to pass through, or the case-connecting outer wall has a rack fixing member for fixed connection with a case blind hole of the case inner wall, wherein the cover-plate-connecting outer wall has a mounting hole for fixed connection with a cover plate, and the cover-plate-connecting outer wall is configured for sealing connection with the cover plate, wherein the mounting bracket comprises a first mounting part and a second mounting part; wherein the cover-plate-connecting outer wall and the mounting hole are located at the second mounting part; and the case-connecting outer wall and the through hole are located at the first mounting part, and the first mounting part is fixedly connected to the case inner wall, so as to press the second mounting part against the case inner wall, wherein one end, away from the cover-plate-connecting outer wall, of the second mounting part has a crimping flange, and the first mounting part has a crimping step hole, the first mounting part is mounted outside the second mounting part through the crimping step hole, and a step surface of the crimping step hole is pressed onto the crimping flange.

2. The mounting bracket according to claim 1, wherein the number of the through hole is at least two, and any two of at least two through holes are located in a same plane.

3. The mounting bracket according to claim 1, further comprising an auxiliary pressing block, wherein the auxiliary pressing block is configured for fixed connection with the case inner wall, so as to press the case-connecting outer wall against the case inner wall.

4. The mounting bracket according to claim 1, wherein the case-connecting outer wall has a positioning structure configured to be in positioning cooperation with the case inner wall.

5. The mounting bracket according to claim 4, wherein the positioning structure is a positioning hole, and the positioning hole is configured to be in positioning cooperation with a positioning column on the case inner wall.

6. The mounting bracket according to claim 1, further comprising at least one limiting surface, each limiting surface is configured to be in position-limiting cooperation with a limiting member on the case inner wall, the limiting surface is perpendicular to the case-connecting outer wall, or there is an included angle between the limiting surface and the case-connecting outer wall;

in a case that the number of the at least one limiting surface is two, the through hole is located between two limiting surfaces.

7. A mounting bracket for a case, comprising a case-connecting outer wall and a cover-plate-connecting outer wall, wherein the case-connecting outer wall has a rack fixing member for fixed connection with a case blind hole of the case inner wall, wherein the cover-plate-connecting outer wall has a mounting hole for fixed connection with a cover plate, and the cover-plate-connecting outer wall is configured for sealing connection with the cover plate, wherein the mounting bracket comprises a first mounting part and a second mounting part: wherein the cover-plate-connecting outer wall and the mounting hole are located at the second mounting part, the case-connecting outer wall and the through hole are located at the first mounting part, and the first mounting part is fixedly connected to the case inner wall, so as to press the second mounting part against the case inner wall, wherein one end, away from the cover-plate-connecting outer wall of the second mounting part has a crimping flange;

the first mounting part has a crimping step hole, the first mounting part is mounted outside the second mounting part through the crimping step hole, and a step surface of the crimping step hole is pressed onto the crimping flange;

wherein the rack fixing member is a screw stud, and the case blind hole is a threaded hole; and

the mounting bracket for a case is a mounting column, the rack fixing member is located at one end of the mounting column, and a cross section of the mounting column is of a regular hexagon.

8. The mounting bracket according to claim 1, wherein the cover-plate-connecting outer wall is configured for sealing connection with the cover plate through a mounting bracket seal, the cover-plate-connecting outer wall has a mounting groove for mounting the mounting bracket seal, and the mounting groove is located on a periphery of the mounting hole.

9. The mounting bracket according to claim 1, wherein an axis of the mounting hole is parallel to an axis of the through hole.

10. The mounting bracket according to claim 9, comprising a first mounting part and a second mounting part that are fixedly connected, wherein the first mounting part is of a flat-plate shape, the case-connecting outer wall and the through hole are located at the first mounting part, and the cover-plate-connecting outer wall and the mounting hole are located at the second mounting part.

11. The mounting bracket according to claim 10, wherein the second mounting part is located in the middle of the first mounting part, or the second mounting part is located at one end of the first mounting part.

12. The mounting bracket according to claim 1, wherein an axis of the mounting hole is perpendicular to an axis of the through hole.

13. The mounting bracket according to claim 12, comprising a first mounting part and a second mounting part that are fixedly connected, wherein the second mounting part is arranged on one side of the first mounting part, an avoidance structure is formed on a side, away from the second mounting part, of the first mounting part, the case-connecting outer wall and the through hole are located at the first mounting part, and the cover-plate-connecting outer wall and the mounting hole are located at the second mounting part.

14. A case, comprising a case body, a cover plate, and the mounting bracket according to claim 1; wherein the case-connecting outer wall has the through hole for a case fixing member of a case inner wall to pass through, the case fixing member is fixed to the case inner wall of the case body, the case further comprises a case connecting member, the case connecting member is fixedly connected to the case fixing member to fixedly connect the mounting bracket and the case body; or the case-connecting outer wall has a rack fixing member for fixed connection with a case blind hole of the case inner wall, and the case blind hole is formed at the case inner wall of the case body.

15. The case according to claim 14, wherein the number of the mounting bracket is at least two, the cover-plate-connecting outer wall has a mounting hole for fixed connection with a cover plate, and the cover-plate-connecting outer wall is configured for sealing connection with the cover plate, at least one of at least two mounting brackets is the mounting bracket according to wherein an axis of the mounting hole is parallel to an axis of the through hole, and at least one of the at least two mounting brackets is the mounting bracket according to wherein an axis of the mounting hole is perpendicular to an axis of the through hole.

16. A case, comprising a case body, a cover plate, and a mounting bracket for the case;

wherein the mounting bracket for the case comprises a case-connecting outer wall and a cover-plate-connecting outer wall, wherein the case-connecting outer wall has a rack fixing member for fixed connection with a case blind hole of the case inner wall, wherein the cover-plate-connecting outer wall has a mounting hole for fixed connection with a cover plate, and the cover-plate-connecting outer wall is configured for sealing connection with the cover plate, wherein the mounting bracket comprises a first mounting part and a second mounting part; wherein the cover-plate-connecting outer wall and the mounting hole are located at the second mounting part; and the case-connecting outer wall and the through hole are located at the first mounting part, and the first mounting part is fixedly connected to the case inner wall, so as to press the second mounting part against the case inner wall, wherein one end, away from the cover-plate-connecting outer wall, of the second mounting part has a crimping flange; and the first mounting part has a crimping step hole, the first mounting part is mounted outside the second mounting part through the crimping step hole, and a step surface of the crimping step hole is pressed onto the crimping flange, the case-connecting outer wall has a rack fixing member for fixed connection with a case blind hole of the case inner wall, and the case blind hole is formed at the case inner wall of the case body, wherein a case fixing column is fixed to the case inner wall of the case body, and the case blind hole is formed at the case fixing column.

17. An electrical device, comprising the case according to claim 14.

* * * * *